US008676361B2

(12) United States Patent
Paddock et al.

(10) Patent No.: US 8,676,361 B2
(45) Date of Patent: Mar. 18, 2014

(54) ACOUSTICAL VIRTUAL REALITY ENGINE AND ADVANCED TECHNIQUES FOR ENHANCING DELIVERED SOUND

(75) Inventors: Thomas Paddock, Truckee, CA (US); James Barber, Selah, WA (US)

(73) Assignee: Synopsys, Inc., Mountain View, CA (US)

( * ) Notice: Subject to any disclaimer, the term of this patent is extended or adjusted under 35 U.S.C. 154(b) by 871 days.

(21) Appl. No.: 10/516,907

(22) PCT Filed: Jun. 5, 2003

(86) PCT No.: PCT/US03/17788
§ 371 (c)(1),
(2), (4) Date: Aug. 9, 2005

(87) PCT Pub. No.: WO03/104924
PCT Pub. Date: Dec. 18, 2003

(65) Prior Publication Data
US 2006/0098827 A1 May 11, 2006

Related U.S. Application Data

(60) Provisional application No. 60/472,180, filed on May 20, 2003, provisional application No. 60/386,541, filed on Jun. 5, 2002.

(51) Int. Cl.
*G06F 17/00* (2006.01)
(52) U.S. Cl.
USPC .............................................. 700/94; 381/106
(58) Field of Classification Search
USPC ................ 381/94.3, 106, 61, 94.2; 333/14
See application file for complete search history.

(56) References Cited

U.S. PATENT DOCUMENTS

| 3,539,725 | A | | 11/1970 | Hellwart et al. |
| 4,396,806 | A | * | 8/1983 | Anderson ..................... 381/103 |
| 4,628,530 | A | | 12/1986 | Op De Beek et al. |
| 4,633,483 | A | | 12/1986 | Takahashi et al. |
| 4,747,142 | A | * | 5/1988 | Tofte ............................... 381/27 |

(Continued)

FOREIGN PATENT DOCUMENTS

| JP | 2002-159099 | 5/2002 |
| KR | 0139176 | 2/1998 |

(Continued)

OTHER PUBLICATIONS

Paul White, Advanced Compression Techniques, Part 1, Sound on Sound, Dec. 2000, http://www.soundonsound.com/sos/dec00/articles/adcompression.htm, 3 pages.*

(Continued)

*Primary Examiner* — Joseph Saunders, Jr.
(74) *Attorney, Agent, or Firm* — Fenwick & West LLP

(57) ABSTRACT

Techniques and systems for enhancing delivered audio signals are disclosed which may be employed in a delivery system at a server side, a client side, or both. The techniques include forming a processed audio signal by processing audio signals through multiple pathways which operate on different frequency bands using dynamic processing and other elements, and thereafter providing recording or listening environment enhancements and other sound enhancements to the processed audio signal. Also disclosed are techniques and systems for implementing the multi-pathway processing and environmental and sound enhancements.

17 Claims, 17 Drawing Sheets

(56) References Cited

U.S. PATENT DOCUMENTS

| | | | |
|---|---|---|---|
| 5,077,800 A * | 12/1991 | Dupret et al. | 381/316 |
| 5,420,929 A | 5/1995 | Geddes et al. | |
| 5,524,022 A * | 6/1996 | Kihara et al. | 375/229 |
| 5,805,715 A * | 9/1998 | Rhee | 381/98 |
| 6,091,824 A | 7/2000 | Lin et al. | |
| 6,344,810 B2 | 2/2002 | Velazquez | |
| 6,606,388 B1 * | 8/2003 | Townsend et al. | 381/17 |
| 2002/0075965 A1 * | 6/2002 | Claesson et al. | 375/260 |

FOREIGN PATENT DOCUMENTS

| | | |
|---|---|---|
| TW | 454172 | 9/2001 |
| TW | 479220 | 3/2002 |
| TW | 484265 | 4/2002 |
| TW | 487867 | 5/2002 |
| WO | WO 01/50459 A1 | 7/2001 |
| WO | WO-02/25886 A1 | 3/2002 |

OTHER PUBLICATIONS

Paul White, Advanced Compression Techniques, Part 2, Sound on Sound, Jan. 2001, http://www.soundonsound.com/sos/jan01/articles/advanced.asp, 3 pages.*

Australian Office Action, Australian Application No. 2003251403, Oct. 1, 2008, 3 pages.

Canadian Office Action, Canadian Application No. 2,488,689, May 6, 2010, 2 pages.

Chinese Office Action, Chinese Application No. 03818449.4, Mar. 14, 2008, 14 pages.

European Supplementary Search Report, European Application No. 03757361.5, Sep. 2, 2008, 4 pages.

European Examination Report, European Application No. 03757361.5, Jan. 16, 2009, 5 pages.

European Summons to Attend Oral Proceedings Pursuant to Rule 115(1) EPC, Jan. 19, 2010, 3 pages.

European Provision of the Minutes in Accordance with Rule 124(4) EPC, May 17, 2010, 5 pages.

European Decision of the Examining Division, European Application No. 03757361.5, May 3, 2010, 12 pages.

European Processing of Appeal, European Application No. 03757361.5, Sep. 27, 2010, 2 pages.

European Processing of Appeal, European Application No. 03757361.5, Oct. 1, 2010, 2 pages.

EP Commencement of Proceedings before the Board of Appeal, European Application No. 03757361.5, Oct. 12, 2010, 2 pages.

Indian Office Action, Indian Application No. 2752/CHENP/2004, Jul. 29, 2010, 2 pages.

Indian Office Action, Indian Application No. 2752/CHENP/2004, May 3, 2011, 1 page.

International Search Report, PCT Application No. PCT/US03/17788, Oct. 12, 2004, 6 pages.

Japanese Office Action, Japanese Application No. 2004-511932, Jul. 14, 2009, 7 pages.

Japanese Office Action, Japanese Application No. 2004-511932, Jan. 18, 2011, 5 pages.

Korean Office Action, Korean Application No. 10-2004-7019885, Aug. 31, 2009, 6 pages.

Korean Office Action, Korean Application No. 10-2004-7019885, May 14, 2010, 7 pages.

Korean Office Action, Korean Application No. 10-2004-7019885, Feb. 25, 2011, 8 pages.

Schroeder, M.R., "Number Theory in Science and Communication," pp. 164-167, 180-183, 1984, Springer-Verlag, Germany.

Taiwan Office Action, Taiwan Application No. 092115246, Nov. 21, 2008, 4 pages.

Taiwan Office Action, Taiwan Application No. 092134187, Oct. 14, 2009, 11 pages.

Canadian Office Action, Canadian Application No. 2,488,689, Dec. 15, 2011, 4 pages.

Davies et al, "Squeeze Me, Stretch Me: The DC 24 Users Guide", RaneNote 130, Rane Corporation, 1993.

* cited by examiner

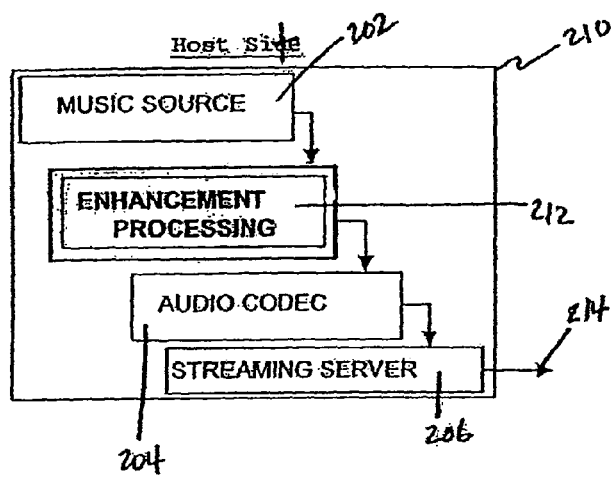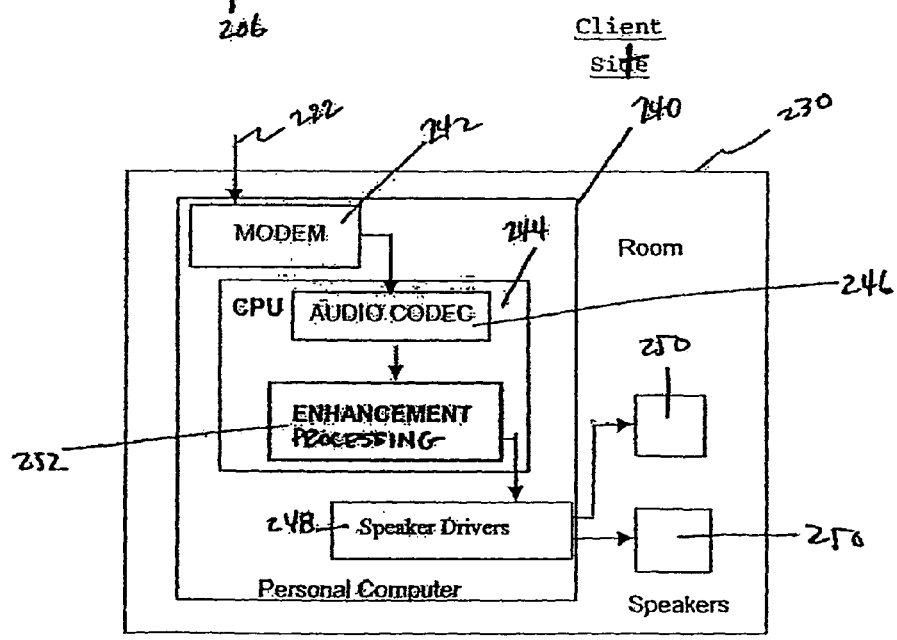
FIGURE 2

ACOUSTICAL VIRTUAL REALITY ENGINE AND ADVANCED TECHNIQUES FOR ENHANCING DELIVERED SOUND

This application claims priority to U. S. Provisional Application Ser. No. 60/386,541, titled "Advanced Technique for Enhancing Delivered Sound," filed on 5 Jun. 2002, and to U. S. Provisional Application Ser. No. 60/472,180, titled "Acoustical Virtual Reality Engine," filed on 20 May 2003.

TECHNICAL FIELD

The present application relates to advanced processing techniques for enhancing delivered audio signals, such as music delivered over limited bandwidth connections, and more specifically to processing techniques for creating a live performance feeling in a listener listening to a digital sound recording delivered from any source of digital information.

BACKGROUND

The rapid spread of the Internet has brought with it a rush to develop newer and more effective means for using its communicative techniques, beyond mere text-based applications. Two new applications that have garnered interest are audio and video broadcasting. Both of these applications have a common problem: their utility suffers when the connection to the Internet is limited in bandwidth. Because of its greater demands on bandwidth, video broadcasting is particularly problematic for the bulk of the Internet end-users (i.e., clients) who use limited bandwidth connections.

One common method of delivering audio, such as music, on the Internet is the "downloading" of audio files to the client's computer. Digital audio files are also commonly copied and compressed into MPEG audio, or other formats, onto a compact disc (CD), personal player or a computer hard drive, where they may be listened to in a more favorable or portable listening environment, compared to streaming audio.

Another common form of Internet-delivered audio is streaming audio. "Streaming" refers to listening while downloading. Generally, the server has a very high bandwidth connection to the Internet, relative to the client's connection. In the use of streaming audio for music, an Internet host site (i.e., the "server") provides live music concerts, disc-jockey selected music or archived music to the listening end user (i.e., the "client") via an Internet connection. But due to the typical limited bandwidth connections of clients, streaming or downloaded (compressed) music is far from an ideal listening experience, particularly for clients accustomed to CD quality music.

The degradation of the listening experience can be traced to two main sources: the compromises made upon compressed signals to compensate for limited bandwidth transmission requirements or reduced file size needs for storage purposes, and poor listening environments of the client. With respect to the latter, Internet-downloading or downloaded music is frequently listened to on speakers attached to the client's computer, and, generally, little attention is paid to providing a good listening environment where the computer is situated. While recent efforts have been directed to ameliorate the limited channel bandwidth problem, the problem of the poor listening environment has yet to be satisfactorily resolved. Accordingly, it would be advantageous to provide for technological solutions that enhance the environment in which a client will receive and listen to sound signals received over a limited bandwidth connection. Furthermore, it would be advantageous to provide a system that can compensate for the distortion that results from compressing audio files into a smaller file size.

Performed music is composed of an extremely complex dynamic sound field. The constantly changing listening environment of audience members and musicians along with variances in timbre, meter and unpredictable live performance dynamics combine to create a unique and moving musical experience. A live sound field is created when instruments and voices, supported by environmental acoustics, meet to form a time domain based acoustical event. Each of these elements is in constant dynamic change. Room modes and nodes vary with listener position; music dynamics change with the artists' moods; even a listener's head position varies the experience from moment to moment.

Various schemes have been used by others to clarify voice and solo instruments in digital recordings. The most common method used in traditional enhancement techniques is the addition of harmonic distortion to the upper frequency range of the sound wave ("exciter"). But artificially injecting distortion into a stereo sound field creates user fatigue and discomfort over time. Enhancement processes based on "exciter" type processing often require a bass boost circuit to compensate for thinness created by over-emphasizing high frequency harmonics.

Another approach deployed in televisions and car stereos for clarity enhancement of a stereo waveform is the addition of a time delay circuit in the low frequency range along with a time delay circuit in the mid frequency range, where both delays are set to a fixed delay point relative to the high frequency range. The purpose of this circuit is not acoustical simulation, but speaker normalization and is meant to compensate for impedance in the speaker circuit causing frequency-dependant phase errors in an amplified and acoustically transduced sound wave. In this design, the high frequency level is adjusted by a VCA control voltage that is initially set by the user with an "adjust to taste" level control and is concurrently dynamically adjusted ratiometrically after a calculation of the RMS summed values of the delayed mid- and low-frequency bands. Banded phase-shift techniques emphasize upper-frequency harmonics and add a high frequency "edge" to the harmonic frequencies of the overall mix, but can mask and reduce the listener's ability to discern the primary fundamental frequencies that give solo instruments and voices depth and fullness, rendering them hollow sounding and not believable. Another problem with this speaker correction method is that it is not useful with all types of transducers, but is only useful with those transducers that exhibit the type of high- and mid-frequency time delay errors that match the time correction circuits within this process.

Another approach used for clarity enhancement of a mix is the addition of a time delay circuit in the low frequency range set to a formulaic delay point relative to the high frequency range. Banded phase-shift techniques emphasize upper-frequency harmonics and add a high frequency "edge" to the overall mix, but mask and reduce the listener's ability to discern the primary fundamental frequencies that give solo instruments and voices depth and fullness. The effect of phase-shift techniques, when combined with a compensating bass boost circuit, is the "loudness curve" effect: more bass and treble with de-emphasized solo instrument and voice fundamental frequencies.

Compressors and voltage controlled amplifiers (VCAs) have been applied to more sophisticated versions of these high frequency boosting circuits to adjust the amount of distortion or phase-shifted material applied to the original sound wave based on detected signal RMS values.

While useful as special effects on individual tracks prior to summing the track into a stereo mix, high frequency boost ("exciter") processes are too deleterious to the fundamental frequencies of solo instruments and voice, and to the overall balance of the stereo sound field, to be used as a professional-quality stereo mastering tool. Additional compression or downsampling of the music waveform can cause very unpredictable negative effects when distortion or phase-shift signals are added prior to signal density reduction. Loudness curve schemes are effective at low listening levels, yet moderate or high listening volumes cause the mix to sound harsh and edgy, leading to listener fatigue and dissatisfaction.

It is therefore desirable to provide signal processing methodology technology that accurately creates a live performance feeling in a user listening to a digital recording or other source of digital information, without the undesirable side-effects produced by conventional practices.

SUMMARY OF THE DISCLOSURE

An improved audio signal processing method and system is disclosed in this application. The disclosed method/system is used to enhance the quality of an audio signal that is about to be compressed and/or has been compressed. The system uses an array of adjustable digital signal processors (DSPs) that perform different functions on the audio signal feed. According to one embodiment, the method/system can be used to "rip" an audio signal before it is compressed to a smaller format. As described above, compression of the audio signal may be necessary in order to transmit the signal over a limited bandwidth network connection. Compression may also be necessary in order to store copies of an audio signal on media with limited storage space, such as diskettes, CD-ROMs, flash memory, and magnetic drives. Another embodiment of the method/system is used to enhance audio signals after they are decompressed. For example, the method/system may be used with a client-based streaming media receiver to enhance the audio signal after it is decompressed by a streaming receiver. According to another example, the method and system enhances the audio signal as it is read and decompressed from limited storage media. In a preferred embodiment, the disclosed method/system is used at both the compression and decompression ends of the audio stream. It is contemplated, however, that the disclosed method/system can be used exclusively at either of the compression or decompression ends of the audio stream.

One application for an upstream (i.e., compression-end) embodiment of the method/system is a "ripping" program that processes the audio signal at speeds faster than real time. This "ripping" program is useful for enhancing an electronic audio file before it is compressed and stored onto a storage device. Because the "ripping" program operates at speeds faster than real time, the time required to compress the file is greatly reduced. The upstream embodiment of the method/system can also enhance an audio signal before it is transmitted over a limited bandwidth network, such as the Internet. According to this embodiment, the method/system compensates for the distortion that arises from compression prior to transmission over the network. Yet another application is a downstream (i.e., decompression-end) embodiment of the disclosed method/system. The downstream embodiment can be used to enhance the audio signal as it is read and decompressed from the storage media. The downstream embodiment can also be used to enhance a streaming audio signal as it is received by a receiver. Because the disclosed method/system can operate at speed faster than real time, it can effectively enhance the decompressed audio signal with minimal time delay effects.

In accordance with the disclosure of this application, Adaptive Dynamics type processing creates a believable, live sound field that is true to an original actual musical performance through the use of FSM (Flat Spectra Modeling) acoustical environment modeling techniques. The processing techniques described herein can be utilized for the playback of digital music recordings, sound effects, sound tracks, or any digital audio source file, whether the source is a "real" recording or machine-generated (e.g., computer game soundtrack or audio effects). Live music emulates life: unpredictable, sparkling, dynamic and ever-changing. The Adaptive Dynamics type processes are a balanced and life-like approach to performance restoration for digital sound. When combined with the recording environment simulation technology described herein, the sound waveform is analyzed and modified in the time and frequency domains simultaneously, then an acoustical rendering is generated based on predictive modeling of live performances. When used with artificially generated or "foley" sound fields—such as those found in movie sound tracks—or synthesized sound tracks such as those found in games, the use of this technology adds a new dimension of realism never before realized.

The disclosed technology creates a believable acoustical virtual reality generated environment which adds both dynamic intensity and overall sonic realism and clarity to the entire waveform through the combination of broadband Adaptive Dynamics type processing and Flat Spectra Modeling. This can be accomplished through the implementation of a complete 32- and 64-bit virtual-reality acoustics engine, where dialog is articulated, spaces are created and manipulated, and the user has simple and complete control of voice and sound environment characteristics. Each instrument and voice is focused and clear: even the fundamental frequencies that are the primary basis of each musical note. The Adaptive Dynamics type processing approach of the present invention does not add a harsh edge or merely center on harmonics. The present invention reactivates the clarity and "life" of the entire sound field. Definition and focus are maintained in all audio bands with no undue or unnatural harmonic emphasis in any one band.

The Adaptive Dynamics type processes and recording environment simulation technology involves the cooperation of two core processes: a multiple path processing of the sound waveform using several filtered bands, and an unfiltered band, which are lined up in time; and wall and room simulator functionality. The sound waveform is analyzed and modified in the time and frequency domains simultaneously, then an acoustical rendering is generated based on predictive modeling of live performances, by setting processing parameters in these core processes.

The Adaptive Dynamics type processing creates a time beat which is intended to emulate the unpredictable, dynamic, and ever-changing characteristics of live sound. This is accomplished by the use of multiple filtered bands or sound paths, and an unfiltered band or sound path, which are aligned in time, but which differ in acoustic characteristics. These differences in acoustic characteristics are implemented in one disclosed embodiment by applying different compression parameters (e.g., attack, release, gain ratio and target level) for each of the multiple filtered bands and the unfiltered band. For example, the compression applied to the unfiltered band may be set to provide a sound that simulates the way in which sound is emanated from a stage where there is no surrounding environment, while the compression for a midrange band is set to simulate a sound emanating from a more lively environment, such as a scoring stage. These differences cause a time beat to be created between the sounds being output from these different sound paths, and thereby tend to create in the listener a perception of a more lively or dynamic performance. This time beat preferably is created without the use of time delays between the sound paths.

Another important feature of the disclosed embodiments is the use of wall and/or room effects processing following the Adaptive Dynamics type processing to provide a "tail" to the sounds. The wall/room effects processing add early, mid and late reflection components to the sound, and thereby create a virtual shell or set of surfaces around the performance. This shell or set of surfaces can be varied according to the environment which is desired to be created.

The Adaptive Dynamics type processing when combined with the walls block (early reflections) combined with the room block (late reflections) serve to simulate a random event like a musical performance coupled with a relatively static system (with some variance due to sound waves impinging on materials) such as an acoustic environment. The combination of the unpredictable event (through Adaptive Dynamics type processing) combined with the predictable environment (through wall and room reflections) is unique and provides a perception in the listener which analogous to a live music experience. Therefore, the disclosed technology accurately creates a live performance feeling in a user listening to a digital music recording, movie or game sound track, or other source.

Another element that could also increase believability in the process as a proper simulator for a live event would be the addition of a mechanism (such as a microphone and a speaker) for determining the characteristics of the user's listening environment which would give the overall process information about listening levels, impulse response of the listening space, and time and frequency information regarding the listening space and transducers used by the listener. This information, although optional to the proper operation of the disclosed embodiments, could be used as a calibration of the system.

BRIEF DESCRIPTION OF THE DRAWINGS

A more complete understanding of the present invention may be derived by referring to the detailed description and claims when considered in conjunction with the accompanying drawings.

FIG. 2A is a block diagram illustrating enhancement processing occurring at a server-side of a network, in accordance with a preferred embodiment.

FIG. 2B is a block diagram illustrating the enhanced processing occurring at a client-side of a network, in accordance with a preferred embodiment.

DETAILED DESCRIPTION OF PREFERRED EMBODIMENTS

Techniques for enhancing sound delivered to a user via a limited bandwidth transmission system, or from a compressed digital file, are disclosed herein. And more particularly, what is disclosed are techniques for client-side enhancement of sound files, which can be delivered as streams or as downloads via the Internet or other means to client devices such as CD, portable players, set-top boxes and the like, and which can be played over a computer-based sound system having limited fidelity and in an environment with ambient noise or other poor acoustical attributes. Also disclosed are techniques for compressing an audio signal at speeds faster than real-time so that the audio signal can be broadcast over a limited bandwidth connection. Other embodiments include client-based applications wherein an audio signal is enhanced after it is decompressed, such as a streaming media receiver or an electronic audio file player (i.e., an MP3 player). Accordingly, the disclosed method/system can be used in the following applications:

a server-side "ripper" operating a speeds faster than real-time;

a client-side enhancer device without the need for pre-ripped sound files;

a broadcast server where audio signals are enhanced in real-time;

a receiver client where audio signals are enhanced in real-time;

a server-side "ripper" where compressed files are decoded later at the client side for further enhancement of quality and clarity; and a client-server arrangement where the audio signal is enhanced at the server side prior to compression and further enhanced at the client side after decompression.

Figure 1:
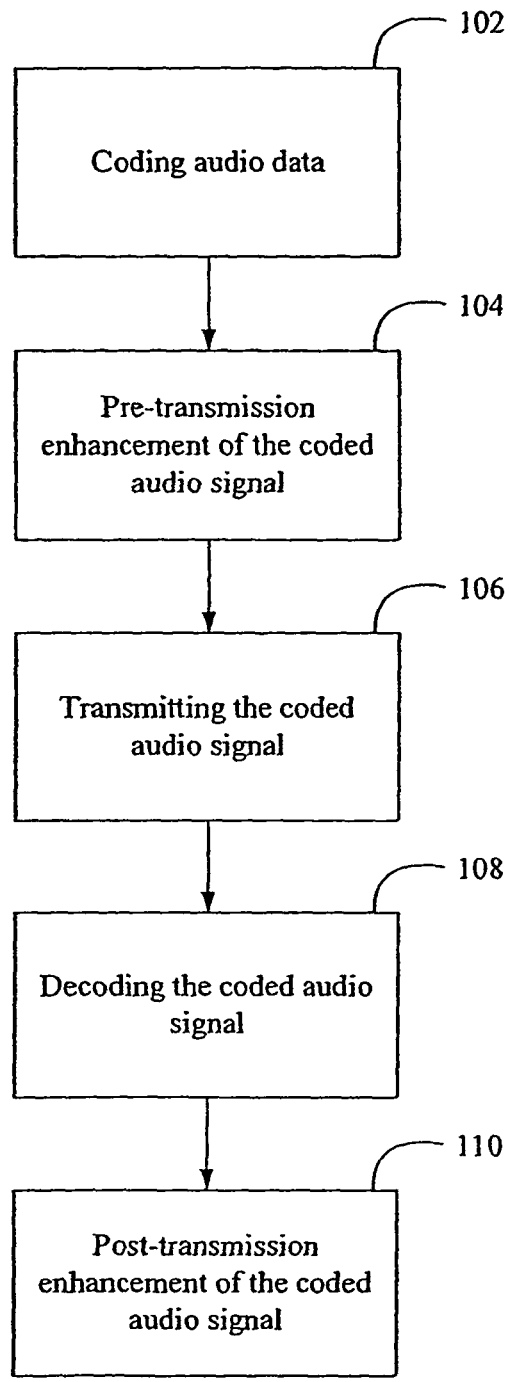
FIG. 1 is a flow diagram of an advanced technique for enhancing compressed audio data, in accordance with a preferred embodiment.

FIG. 1 is a flow diagram depicting an advanced technique for enhancing audio data, in accordance with a preferred embodiment. At step 102, audio data is coded in a digitally formatted signal. At this point, the digital signal may also be compressed in preparation for subsequent transmission. Once in a digital format, at step 104, the coded audio signal can be enhanced by using various processing techniques that emphasize frequencies and dynamics expected to be lost or destroyed during subsequent transmission. Thereafter, at step 106, the enhanced audio signal is transmitted over a connection, which may be of only low or medium bandwidth, to a network, such as the Internet. After reaching a client site, at step 108, the transmitted audio signal is decoded (and also decompressed if necessary). Finally, at step 110, the now decoded audio signal is subjected to further enhancement processing to recover the frequencies and dynamics expected to be lost or destroyed during transmission.

FIG. 2A shows the enhancement processing occurring at the server-side of a network (i.e., the Host Site), in accordance with a preferred embodiment. At the host site 210, music is selected from a music source 202, such as, for example, stored files or a live feed. Interposed between the music source 202 and an audio codec 204 is an enhancement processing element 212. The enhancement processing element 212 enhances the audio signal prior to being coded by the transmitting audio codec 204. Enhancement processing is beneficial if the streaming server 206 is broadcasting to clients with known and/or similar listening environments. Also, it is beneficial when the type of music being broadcast is known or determined, or always of a similar type, because the enhancement processing can be adjusted in a way that maximally benefits that particular kind of music.

The transmitting audio codes 204 processes music through an encoder (i.e., the transmission half of a codec pair) that formats and compresses the music in a manner that is adapted for the bandwidth of the client's Internet connection.

A codec is an encoder/decoder system, that for discussion purposes herein, functions as an audio data-compressor (encoder) and an audio/data decompressor (decoder). A data compressing/decompressing codec is also known as a "compander." In this disclosure, "data compression" will refer to any process which reduces the size of a data file, while "sound-level compression" will refer to any process which reduces the dynamic range of an audio signal. Some commonly used codecs are Sony 8Track, Dolby AC3, and WMA (UP3).

After applying the transmitting audio codec 204, a streaming server 206 then transmits the data-compressed and formatted music data to the designated address over output connection 214 to the Internet. Although this description primarily refers to the streaming and enhancement of music, it equally applies to any audio or audio/video material. Further, it should be noted that this system and technique can be used with a variety of sound transfer protocols, including, for example, Real Audio, MP3, and Windows Media.

As used herein, "real-time" means that the listening client hears the music substantially at the same time as the server is processing it within the audio codec. While there may be some delay resulting from the connections to the speakers to be considered "real time" it is preferable that there be no substantial buffering of any segment of the music between the music stream at the music source and the speakers where the client is listening, and sequential music segments follow at the speakers. Downloaded files may be stored in their entirety and played at a later time and are preferably compressed in the same way as streaming files, although the compression ratio may be less than the ratio used for real-time streaming.

FIG. 2B shows the enhanced processing occurring at the client-side of a network (i.e., "decoder-side enhancement") in accordance with a preferred embodiment. This type of enhancement processing is beneficial in circumstances where there is a wide variety of listening environments and/or music types. Through low or medium bandwidth connection 222, the enhanced, coded signal reaches the client site 230. Specifically, the signal 222 can be provided to a personal computer 244 or another suitable processing platform. In the preferred embodiment, the personal computer 244 includes a modem 242, a processor 244 associated with the receiving audio codec 246 and an enhancement processing element 252, speaker drivers 248, and speakers 250. Like the enhancement processing element 212 provided at the server site 210, the enhancement processing element 252 preferably provides for enhancement of a decoded signal, after it has been decoded by the receiver audio codec 244.

The processor of the client's receiving codec 246, which is associated with the CPU 244, performs what is largely the inverse of the server's transmitting audio codec 244. Specifically, the receiving codec 246 converts the data stream back to a readily-usable music format, and uncompresses the music to restore it as closely as possible to its original quality at the music source 202. The receiving audio codec 244 process may be running in software on the CPU 244, or may be performed in hardware by the use of an add-on sound card. Speaker drivers 48 can also be found on the sound card or implemented in software. Speakers 250 in a typical client's listening environment consist of a pair of poor- to medium-quality midrange drivers, and may include a woofer and/or subwoofer. The client site 230 in which the client and computer are located is the last component of the listening environment: it considerably affects the quality of the perceived sound because of its spectral response, such as resonances, and the ambient noise that it introduces.

The transmitting audio codec 204 and receiving audio codec 246 are designed to produce an output that is substantially similar to the input signal, given the bandwidth limitations of the connection between them. The data-compression processes of those codecs (204, 246) may introduce undesirable artifacts and distortions. Those compression procedures are not necessarily modified by the advanced techniques described below.

In the configurations of FIG. 2B (and FIG. 3), the enhancement processing element 252 is preferably software associated with the processor. But other arrangements are also envisioned for alternate embodiments. For example, the processing may take place in a specialized digital signal processor located either locally or on a connected device.

Figure 3:
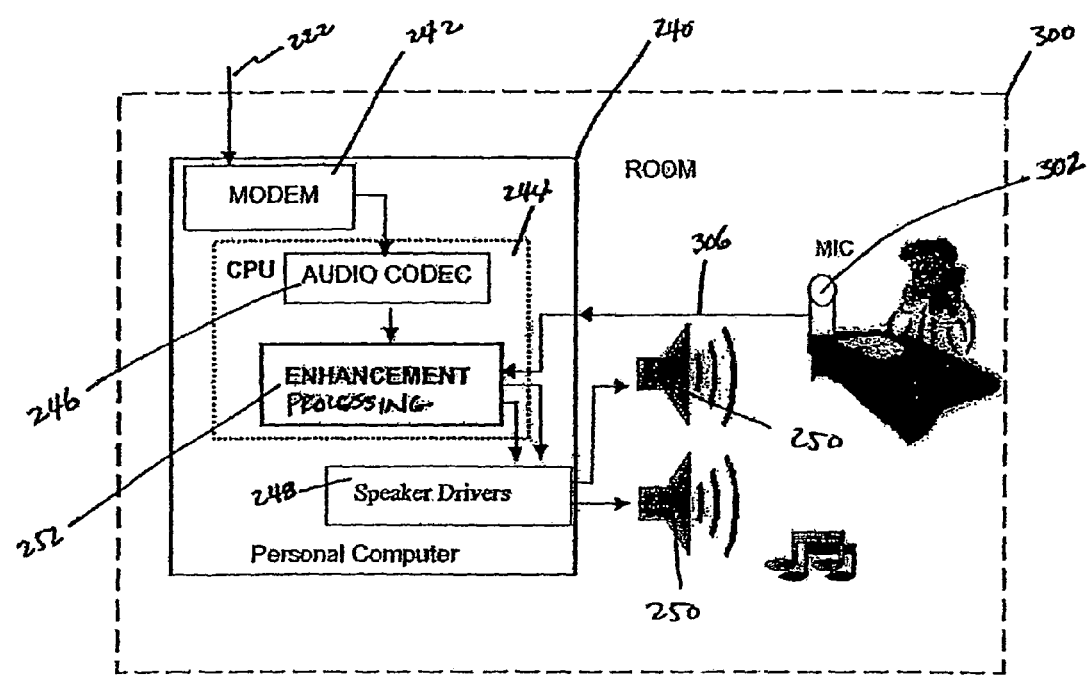
FIG. 3 is a block diagram illustrating the enhanced processing occurring at the client-side of the network, in accordance with another preferred embodiment.

FIG. 3 shows the enhanced processing occurring at the client-side of the network, in accordance with another preferred embodiment. Distinguishing from the embodiment depicted in FIG. 2B, a microphone 302 is included at the client site 300 in the embodiment depicted in FIG. 3. The microphone 302 is connected via coupling 306 to the enhancement processing element 252 to provide feedback to the element. Based on that feedback, the enhancement processing element 252 is able to provide additional control of the speaker drivers 248.

Several improvements and techniques are utilized to allow for exceptional processing performance with the use of only modest or typical power. One such technique is to do the sound processing using an extended bit depth to produce a large dynamic range in the system, obviating the need for strong input-limiters and reducing truncation error noise.

The degree to which any type of processing (e.g., mixing of signals, equalizing, compression, etc.) alters the original digital data varies inversely with the bit resolution of the data. For the sake of illustration only, the below described techniques employ 64-bit sound samples for stages of the data processing. It is contemplated, however, that other sample sizes can be utilized, such as 8-bit, 16-bit, 24-bit, and 32-bit.

Figure 4:
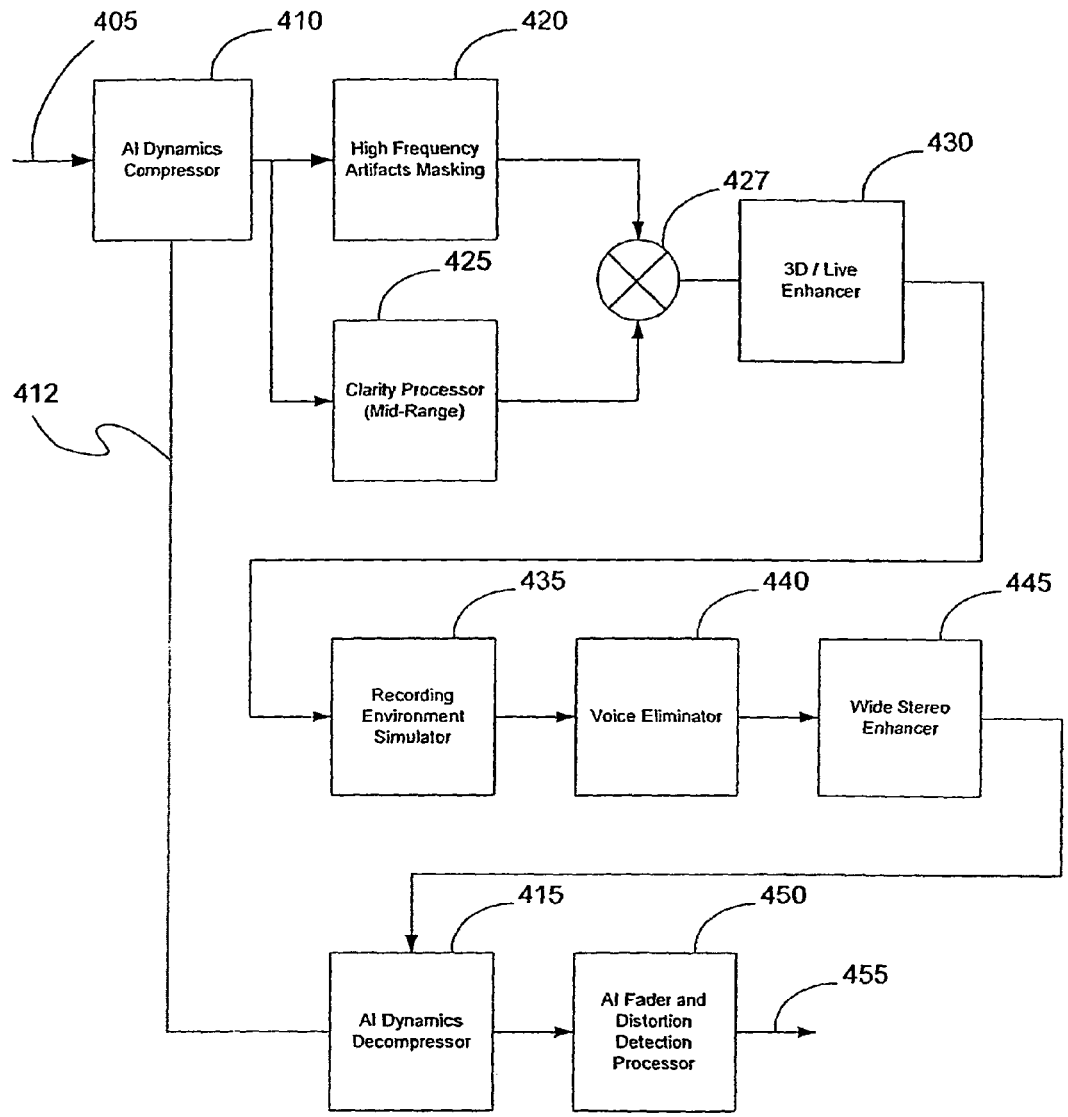
FIG. 4 is a block diagram illustrating signal processing functions for enhancing audio signals, in accordance with a preferred embodiment.

FIG. 4 is a block diagram illustrating signal processing functions for enhancing audio signals, in accordance with a preferred embodiment. In FIG. 4, an audio signal 405 is provided to an artificial intelligence (AI) dynamics compressor 410. The AI dynamics compressor 410 works in tandem with the AI dynamics decompressor 415 through signal line 412 in order to enhance the dynamic range of the incoming audio signal 405 to a desired range. An offset in these two processors 410, 415 creates an overall dynamic expansion of the signal. After being processed by the AI dynamic compressor 410, the audio signal is processed by two components placed in parallel: a high frequency artifacts masking processor 420; and a clarity processor (mid-range) 425. The high-frequency artifacts masking processor 420, which comprises an adjustable filter and a variable time delay circuit, creates a masking effect for undesirable artifacts and undesirable sound from the incoming audio signal. The clarity processor 425, which also comprises an adjustable filter with a variable time delay circuit, creates a realignment effect for undesirable mid-range frequencies in the incoming audio signal. After being processed by these two elements, the audio signal is combined by a mixer 427 and fed into a 3D/live enhancer 430. The 3D/live enhancer 430 adds life and stereo perspective to the sound field of the audio signal. The 3D/live enhancer 430 uses three-dimensional modeling to determine the extent of signal processing that occurs. After the audio signal has been processed by the 3D/live enhancer 430, it is processed by the recording environment simulator 435, which adds diffusion, reverb, depth, regeneration, and room decay to the audio signal. The recording environment simulator 435 accomplishes these effects without adding resonant modes and nodes to the virtual recording room. After being processed by the recording environment simulator 435, the audio signal is processed by a voice eliminator 440, which effectively eliminates vocal track in the audio signal. The function is accomplished because most vocal tracks are centered and are relatively dry in the overall audio signal. After the voice signals have been removed, the audio signal is processed by a wide stereo enhancer 445, which adds wider stereo perspective to the sound field of the audio signal. At this point, the audio signal is fed into the AI dynamics decompressor 415, where it is processed with artificial intelligence algorithms to ensure that the full dynamic range of the audio signal is restored. After the audio signal is processed by the AI dynamics expansion processor 415, it is then processed by an AI fader and distortion detection processor 450, which adjusts the level (i.e., volume) of the signal until the optimum gain is achieved. The AI fader and distortion detection processor 450 is adapted to dynamically adjust the gain of the audio signal so that a consistent signal level is continuously delivered to the listener. At this point, the processed audio signal 455 may be fed to a driver or set of drivers so that an individual can listen to the signal.

Figure 5:
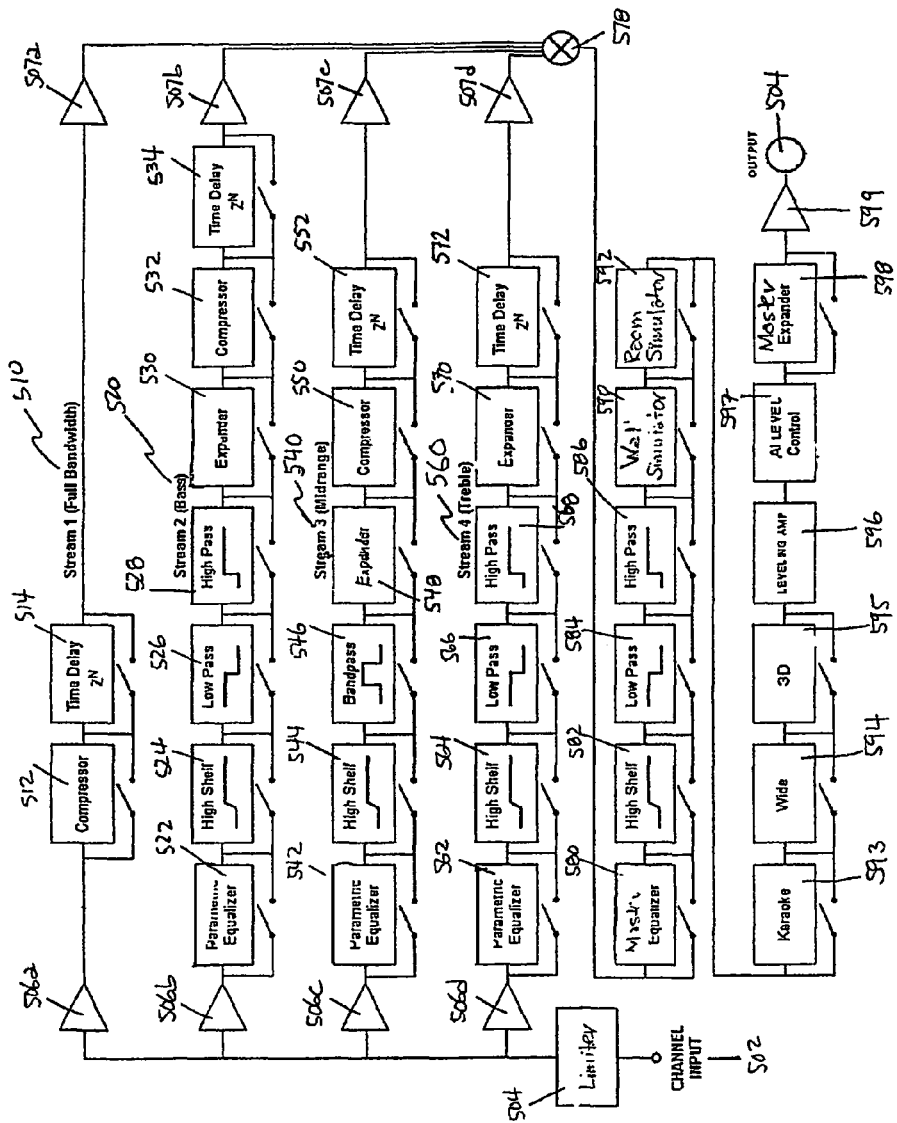
FIG. 5 is a block diagram illustrating signal processing functions associated with client-side enhancement of limited bandwidth music, in accordance with a preferred embodiment.

FIG. 5 is a block diagram illustrating signal processing functions associated with client-side enhancement of limited bandwidth music, in accordance with a preferred embodiment. While only one channel of processing is shown in FIG. 5, it should be appreciated that multiple processing channels may be so employed. Further, the below-described decoding and enhancement processes are preferably software routines running on a processor, and therefore references to signal paths refer to common programming techniques of passing data from one routine to another. Thus, consistent with the preferred embodiment, a signal path or pathway is not intended to refer to a physical connection; however, distinct connections may be used in alternate embodiments.

The enhancement process starts with the audio signals outputted from the reception codec 246. Initially, the signal is directed through channel input 502 to the limiter 504. The limiter 504 is preferably a standard audio limiter, i.e., a processing function that keeps the louder sections of the sound from overwhelming the downstream processing due to lack of dynamic range. In response to the sound levels, the limiter 504 makes gain changes which may have a coloring effect on the sound, such as "pumping" and "clipping." Changes in gain, which occur as the result of limiting or decompression, are often noticeable by the listener, and this is referred to as "pumping." "Clipping" occurs when the signal exceeds the maximum possible value available in a system.

The output of the limiter 504 splits the signal into four discrete pathways or bands. They are referred to as the full bandwidth pathway 510, the bass pathway 520, the midrange pathway 540, and the treble pathway 560. Each pathway is preferably processed independently. The full bandwidth pathway 510 is for the full-bandwidth sound to reach the output mixer 578. In contrast with the processing of the various filtered bands discussed below, the full band pathway 510 is preferably not sound-level decompressed. The bass, midrange, and treble pathways (520, 540, 560) preferably filter the signal into non-overlapping frequency bands.

It should be appreciated that more or fewer pathways may be employed. For example, there may be an additional pathway for a sub-woofer band and the mid-frequency band may be divided into two separate mid-frequency bands. When the number of frequency bands used in an alternate embodiment is very high, the filtering is preferably provided by an ARBI filter. For example, the limiter 504 may be an ARBI filter having three hundred stereo channels for dynamic, parametric filtering (and therefore also require three hundred stereo channels of sound-level decompression and three hundred stereo channels of time-delay alignment).

Prior to processing, the respective inputs of full bandwidth, bass, midrange, and treble pathways (510, 520, 540, 560), are amplified by amplifiers 506a-d. After processing, the respective outputs of the full bandwidth, bass, midrange, and treble pathways (510, 520, 540, 560) are amplified by amplifiers 507a-d and then combined at the mixer 578.

Each frequency band formed by the filters is processed independently by the various processing elements shown in FIG. 5 and described in the subsequent paragraphs.

With the exception of the full band pathway 510, each band includes an equalizer for parametric equalization. Such parametric equalizers are denoted by reference numbers 522, 542, and 562 for the bass, midrange, and treble pathways (520, 540, 560), respectively. Each such parametric equalizer (522, 542, 562) provides multiple narrow-band filters, each of which has a control for gain, bandwidth or "Q," and central frequency. The equalizers (522, 542, 562) may include a Nyquist compensation filter, which reduces spurious signals due to sampling aliasing.

A specific, programmable, sound-level expansion or compression for each frequency band is carried out by dynamic processing elements included in each of the bass, midrange and treble pathways (520, 540, 560). Such processing elements preferably comprise various filters together with an expander and/or compressor. The bass pathway 520 preferably comprises a high-shelf filter 524, a low pass filter 526, and a high pass filter 528, together with an expander 530 and a compressor 532. The midrange pathway 540 preferably comprises a high-shelf filter 544 and a bandpass pass filter 546, together with an expander 548 and a compressor 550. The treble pathway 560 preferably comprises a high-shelf filter 564, a low pass filter 566, and a high pass filter 568, together with an expander 570. The full bandwidth pathway is preferably limited to a compressor 512. It should be appreciated that the processing elements used in each pathway will vary depending on the number and type of bands associated with the pathway as well as other design choices.

Each band (including full bandwidth pathway 510) preferably also provides time delay alignment elements to compensate for the different time delays that the foregoing elements may produce or which may have been produced in recording or processing on the server side. Such time delays elements are denoted by reference numerals 514, 534, 552 and 572 for the full bandwidth, bass, midrange, and treble pathways (510, 520, 540, 560), respectively. Typically, the time delay for proper alignment will be on the order of microseconds.

After processing, each band output is connected to a mixer 578. The mixer 578 provides a signal balance among the four pathways (510, 520, 540, 560), and directs the mixed signal to a master equalizer 580.

The master equalizer 580 provides parametric equalization for the signal that exits the mixer 578. It provides a final, broad-spectrum shaping of the signal. The equalized signal is then (optionally) passed through highly equalized resonant filters to reinforce the subwoofer and bass frequencies. Such filters preferably comprise a high-shelf filter 582, a low pass filter 584, and a high pass filter 586.

A wall simulator 590 can be coupled to the high pass filter 586. The wall simulator 590 uses diffuse-field matrix DFM techniques to produce time delays simulating the reflections from an actual stage. Simulation of such a sound-reflecting environment can add a liveliness, or reverb quality to the music, without introducing unwanted resonant peaks.

Conventional DFM techniques use number theory algorithms for non-harmonic, non-resonant wave reflection. For example, the quadratic residues described in Section 15.8 and the primitive roots described in Section 13.9 of *Number Theory in Science and Communication*, by M. R. Schroeder, Springer-Verlag, Berlin, 1986, second edition can be applied in this context. Those conventional techniques only, however, provide for long-time reflections that would simulate the "reverb" of a room. A primitive root calculation, which improves upon the methods taught by Schroeder by applying a diffuse field matrix DFM technique so as to provide for early reflections of the sound, i.e., reflections within 5 to 30 milliseconds of the direct sound, is preferably employed.

The wall simulator 590 can also help to break-up, re-shape, or remove the unwanted effects of strong periodic processing artifacts or troublesome periodic features. The DFM techniques used in the stage simulator do not use regeneration, i.e., feedback from the output to the input of this processing element. Control parameters of this processing stage include the size and distance from the wall.

The output of the wall simulator 590 is directed to the room simulator 592. The room simulator 592 uses DFM techniques to produce time delays and resonances that are similar to natural room acoustics. The DFM techniques are similar to those used in the wall simulator 590, but use regeneration. The room simulator 592 can add reverb and decay to enhance dry musical material, and further obscure subtle codec-induced distortions. Other parameters of this processing stage include room size, room aspect ratios, and the wet/dry mix. Another use of the room simulator 592 is to compensate for poor room acoustics in the listener's listening environment. The same DFM techniques used for adding natural room or stage acoustics to a dry signal, as described above, can also be used to de-emphasize resonances or filtering in the listener's room, and to provide for a reduction in the room's perceived ambient noise level. For this purpose, the listener's room acoustics are obtained by the use of a microphone placed near the listener's usual listening location, and functionally connected to the CPU, as shown in FIG. 3. DFM techniques are preferably used only in the wall simulator 590 and the room simulator 592, where only the room simulator 592 uses regenerative components.

Various filters may be applied based on the qualities of the client site or listening room, which may be measured and compensated for by the room simulator 592. One filter may compensate for the acoustics of the listening room, which is based on a transform function, $R(\omega)$, having a number of resonances. If much of the room has soft surfaces, such as carpet, drapes or cushioned furniture, then it is likely that the room transform $R(\omega)$ will fall-off at high frequencies. However, if the listening room has many hard surfaces, then it is likely that the high-frequency end of the room transform $R(\omega)$ will not fall-off to such a degree.

The initial step for accomplishing room-resonance compensation is the determination of the acoustics of the listening room using the microphone 302 (see FIG. 3). The room acoustics are determined by using the speakers 250 (see FIG. 3) to produce sound having a known frequency spectrum $N_o(\omega)$, and monitoring the effects of the room acoustics on the sound produced by the speakers using the microphone. The speakers 250 produce a sound such as "white noise," which has equal energy at each frequency. The spectrum $N_i(\omega)$ of the signal transduced by the microphone is then used to calculate the room transform $R(\omega)$ according to $$R(\omega) = N_i(\omega) / [N_o(\omega) M(\omega)],$$

where both spectra $N_i(\omega)$ and $N_o(\omega)$ are measured in decibels on the SPLA scale, and, as above, $M(\omega)$ is the transform produced by the microphone. Or, if $N_o(\omega)$ is a "flat" white noise spectrum, as in the preferred embodiment, then $$R(\omega) = N_i(\omega) / [k\, M(\omega)],$$

A typical compensating room filter would then be just the inverse of the room's spectrum, or $$F(\omega) = 1/R(\omega),$$

where $F(\omega)$ is a compensating filter for the listening room. The filter $F(\omega)$ can be implemented in the enhancer either in the room simulator 592 or the master equalizer 580, or in both.

Another filter may be employed to compensate for ambient noise. Ambient room noise compensation is obtained by boosting specific spectral bands of the music over the corresponding bands of ambient room noise. Such boosting improves the signal-to-noise ratio, and hence the clarity, of the music without resorting to turning up the overall volume. This noise reduction technique will perform well when the noise spectrum is essentially unchanging. As with the filter for acoustics, the microphone 302 (see FIG. 3) may be employed to obtain a measure of the ambient noise within the listening room. The transduction from sound to electricity is described by a microphone transform function, $M(\omega)$. Therefore, the transform describing the transformation from the original sound spectrum to the spectrum of the signal transduced by the microphone is given by $$M(\omega) \cdot T(\omega) = M(\omega) \cdot R(\omega) \cdot S(\omega) \cdot C(\omega) \cdot I(\omega) \cdot P(\omega).$$

The sound heard by the listener is most accurately monitored by placing the microphone 302 near the location of the listener. The spectrum of the filter to compensate for ambient noise will typically have the same general shape as the ambient noise spectrum. Such filter can also be implemented in the enhancer either in the room simulator 592 or the master equalizer 580, or in both.

Further enhancement may be obtained by compensating for the environment in which the music was recorded, or a simulated recording environment (which may actually differ from the environment in which the music was recorded). The client is given a choice of multiple recording environments. According to the preferred embodiment, the following six simulated recording environments may be selected by a client: studio (A, B), hall (A, B), and stadium. For instance, in a studio environment there will be an enhancement of early reflections. Or, in a simulated hall environment there will be short reverb times, while a simulated stadium will have considerably longer reverb times. In a sense, the user becomes a "producer" in that the user simulates how the music was recorded. Alternatively, the application of simulated recording environments may be based solely on the actual environment in which the music was recorded, rather than the user's preference. In this case, the system would correct for unwanted artifacts from the recording, and downloaded or streamed files may include a tag, such as the ID3 tag of MP3 files, which will identify the appropriate recording room acoustics.

The output of the room simulator 592 is connected to the karaoke element 593. The karaoke element 593 has inputs from the room simulators from both stereo channels. These left and right channel signals are compared, and musical components, such as voices, that have equal energy in both channels may be removed to provide a karaoke effect. This is preferably done in a similar manner in the 3D enhancer 595, discussed below, except that the karaoke element 593 does not re-introduce the original stereo signals.

The output of the karaoke element 595 is connected to the wide element 594. The wide element 594 compares left and right channels and then performs arithmetic and delay functions to the two channels in order to change the perceived distance between them. This effect changes the perceived stereo-separation spread of the music. Whereas other attempts to produce an enhanced wideness result in a loss of the low-frequency portion of the signal, the wide element 594 can produce this separation while leaving the low-frequency components substantially unaltered. Processing of this effect is integrated into standard PL-2 processing, a positioning algorithm distributed by Dolby Corporation of San Francisco, Calif. Specifically, the karaoke element 593, the wide element 594, and the 3D enhancer 595 (discussed below), which each require interaction between the left and right channels, accomplish PL-2 decoding with the combined use of both channels.

The output of the wide element 594 is connected to the 3D enhancer 595. The 3D enhancer 595 removes "equal energy" (common-mode) signal content from the stereo signal, (usually solo vocals and instruments) delays it, then re-mixes it with the raw signal using a combination of frequency and time-domain functions. This provides a "widened" sound stage to the listener without delocalizing the equal-energy material.

The output of the 3D enhancer 595 is then connected to the leveling amplifier 596. In turn, the leveling amplifier 596 is connected to the AI level control 597. The AI level control 597 circuit functions to lower the audio level during peak events and then return it after a peak event has passed. To keep sound from distorting during the listening process or while recording it, a human engineer would always drop the volume, by moving the volume control down of the offending instrument or vocal. By essentially simulating a human engineer, the AI level control 597 rapidly moves the audio level down by analyzing the digital stream for distortion and signal overloads to identify peak events. It then returns the volume towards the initial volume setting after the peak event has occurred, without the need for an "always-on" audio compressor circuit, which undesirably leads to a loss of dynamic edge and flat sound.

The output of the AI level control 597 is connected to the master expander 598, which is used to selectively increase the dynamic range of the mastered stereo signal. Output from the master expander 598 is connected to an amplifier 599.

The master expander 598 controls the final output volume level of the system. It allows the listener to set the volume level as high as he or she likes without having to worry about overdriving the speaker driver circuitry or the speakers. This feature is accomplished by a process that detects a speaker-overdriving peak sound level by monitoring for distorted samples. According to the preferred embodiment, a fuzzy logic tally of the amount of clipping is used to determine the degree to which the volume level should be reduced. Alternatively, the process may look ahead at the music stream and predict the arrival of a speaker-overdriving peak sound level. If such a level is reached or predicted to be reached, the master gain level is automatically turned down using a non-linear attenuation-versus-time curve which simulates the attenuation-versus-time that a live person would use.

The master expander 598 is the final stage of enhancement processing and provides the enhanced signal to channel output 504, which, in turn, connects to the speaker driver circuitry. The speaker driver circuitry converts the processor's enhanced digital representation of the signal into a hardware analog signal, and provides the necessary amplification and connectivity to the speaker.

The sound-level decompression described herein provides a widening of the dynamic range of the music to help correct for compressions of the audio signal that have occurred at any time from the recording of the original audio source onwards. Typically, the recording and mixing of music includes sound-level compression of many of the tracks so as to take advantage of the limited dynamic range of the recording medium. Also, some form of compression may be applied post-recording, to reduce the bandwidth for Internet broadcast purposes. This latter type of compression may be substantially removed by the reception codec, but may have been insufficiently corrected for, or otherwise be in need of further expansion to improve the "liveness," or other subjective qualities, of the music. A processing feature using dynamics with different time constants and expansion factors for each emphasis band is preferably employed.

The various processing elements shown in FIG. 5 may be controlled by a master control program that can bypass any of the processes, and can specify the parameters of each process. The "skin" is the interface which allows the client to control parameters and presets, i.e., the "skin" is the visual and interactive part of the enhancement program displayed on the listener's PC screen. Fader controls are available for the listener to specify each parameter in the system, and "radio buttons" (i.e. on/off switches) are available to select groups of preset parameters. The enhancement parameters may be adjusted separately, or various presets may be chosen.

The system may include a "bigness" control that simultaneously controls the parameters of the individual band processors. For low values of the "bigness" parameter, less dynamic processing occurs, and the sound-level dynamic range is equal to that of the music as recorded. For high values of the "bigness" parameter, each band's processing dynamics are increased relative to the sound-level dynamic range of the recorded music.

Preset parameter groups are of two types: listener defined and built-in. Listeners can select presets from their own previously labeled groups, or can select from a menu of built-in presets. Built-in presets are designed based on considerations of bandwidth, code type, listeners' speakers, and music type. Once a listener selects a built-in preset, the listener may then adjust any individual parameter or group of parameters to customize the built-in preset. That adjusted group of parameters can then be labeled and saved as a new preset. For example, if a built-in preset is selected, then the listener may subsequently select a group of room-compensation parameters that may be applied to the selected built-in preset.

Figure 6:
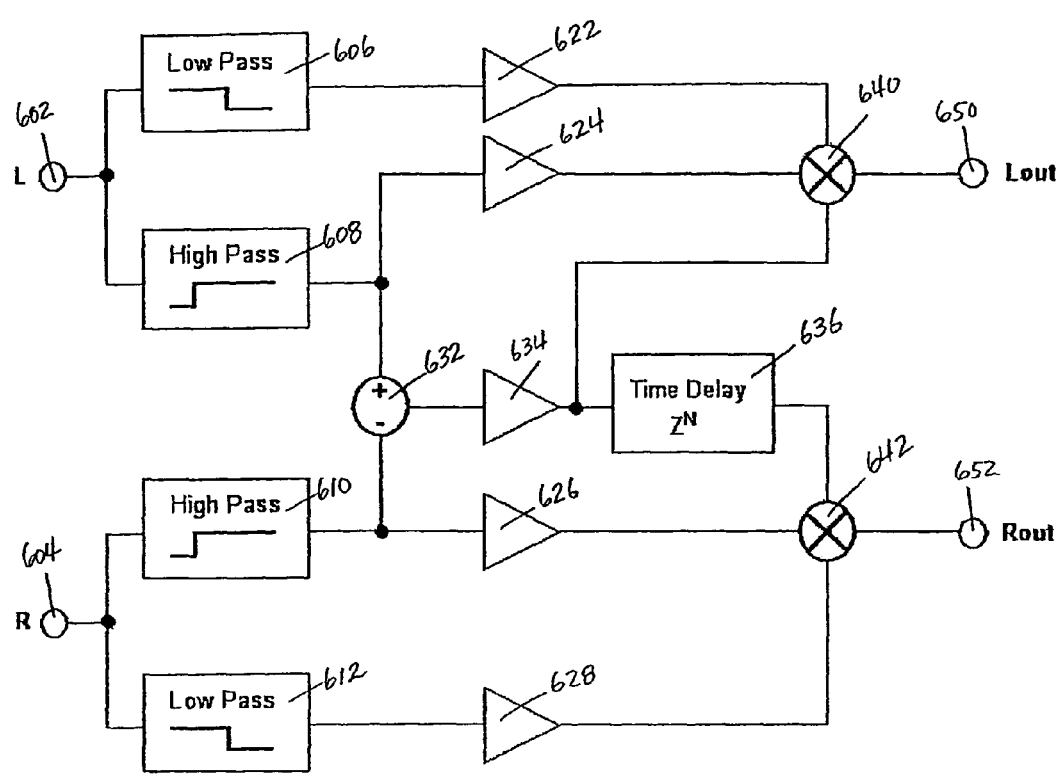
FIG. 6 is a block diagram illustrating signal processing functions for enhancing audio signals, in accordance with another preferred embodiment.

FIG. 6 is a block diagram illustrating a 3D enhancer in accordance with a preferred embodiment. As with other elements, this element has a left input 602 and a right input 604 as well as a left output 650 and a right output 652. One mixer 640 is associated with left output 650, while another mixer 642 is associated with right output 652. The signal associated with left input 602 is passed through a low pass filter 606 and a high pass filter 608. Similarly, the signal associated with right input 604 is passed through a low pass filter 610 and a high pass filter 612. The outputs of the low pass filters 606 and 610 are respectively passed through amplifier 622 and amplifier 628, the outputs of which are respectively directed onto mixer 640 and mixer 642. Similarly, the outputs of the high pass filters 608 and 612 are respectively passed through amplifier 624 and amplifier 626, the outputs of which are respectively directed onto mixer 640 and mixer 642. The outputs of the high pass filters 608 and 612 are also summed together at adder 632 and then directed toward amplifier 634. The output of amplifier 634 is passed onto mixer 640 as well as onto time delay element 636, the output of which is further directed to mixer 642.

The 3D enhancer element is suitably configured to provide a widened soundstage to the listener. The 3D enhancer element, which is similar to the spatial enhancer element described below in connection with FIG. 11, removes "equal energy" (common-mode) signal content from the stereo signal (usually solo vocals and instruments), delays it, then re-mixes it with the raw signal using a combination of frequency and time-domain functions. This provides a "widened" sound stage to the listener without delocalizing the equal-energy material.

Figure 7:
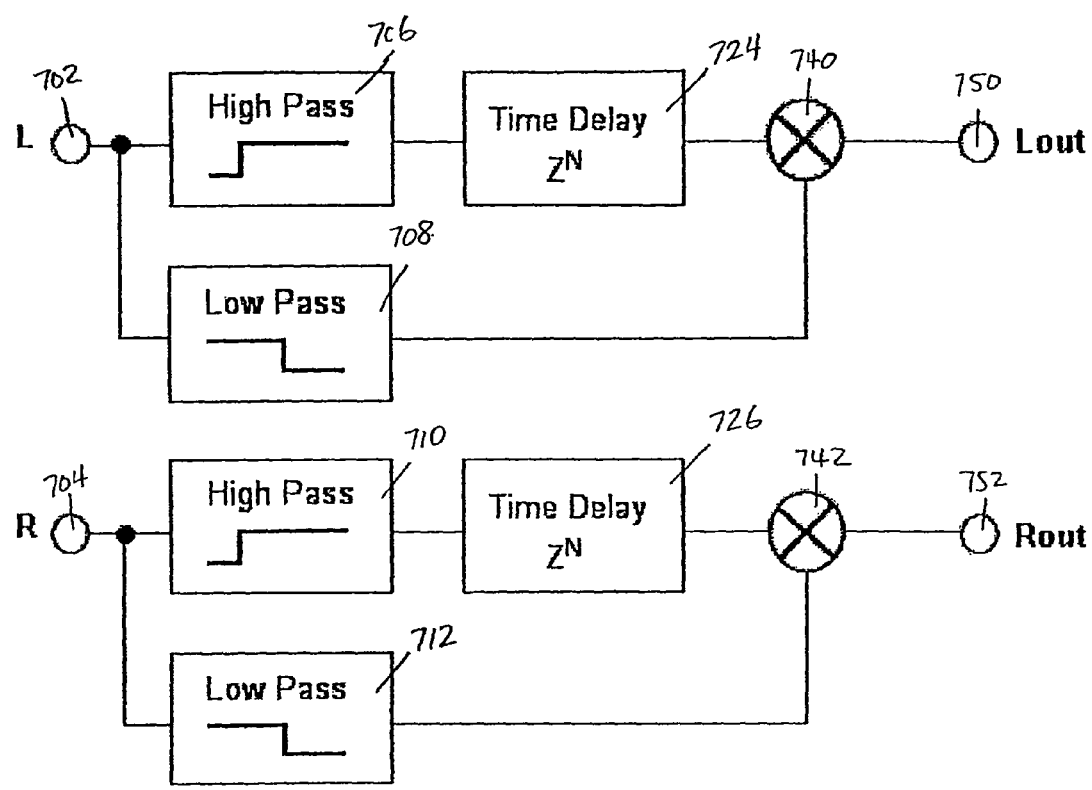
FIG. 7 is a block diagram illustrating signal processing functions for enhancing audio signals, in accordance with another preferred embodiment.

FIG. 7 is a block diagram illustrating a wide element, in accordance with a preferred embodiment. As with other elements, this element has a left input 702 and a right input 704 as well as a left output 750 and a right output 752. One mixer 740 is associated with left output 750, while another mixer 742 is associated with right output 752. The signal associated with left input 702 is passed through a high pass filter 706 and a low pass filter 708. Similarly, the signal associated with right input 704 is passed through a high pass filter 710 and a low pass filter 712. The outputs of the low pass filters 708 and 712 are respectively directed onto mixer 740 and mixer 742. Similarly, the outputs of the high pass filters 706 and 710 are respectively passed through time delay elements 724 and 726, the outputs of which are respectively directed onto mixer 740 and mixer 742. Preferably, the time delay provided by time delay element 724 is greater than the time delay provided by time delay element 726. For example, the time delay associated with element 724 may be 0.05-2.0 milliseconds while the time delay associated with element 726 may be 0.5-30 milliseconds.

The wide element is preferably configured to produce a desired time differential between the left and right channel high frequency information, as processed by the respective high pass filters 706/710. The respective time delay elements 724/726 can be adjusted to provide the desired differential time delay. In practical embodiments, the differential time delay is between 5 and 22 milliseconds, and preferably about 20 milliseconds, which falls within the Haas effect (or precedence effect) range. In operation, one of the time delay elements can be set to a fixed delay value while the other time delay element is varied to achieve the desired Haas effect.

Figure 8:
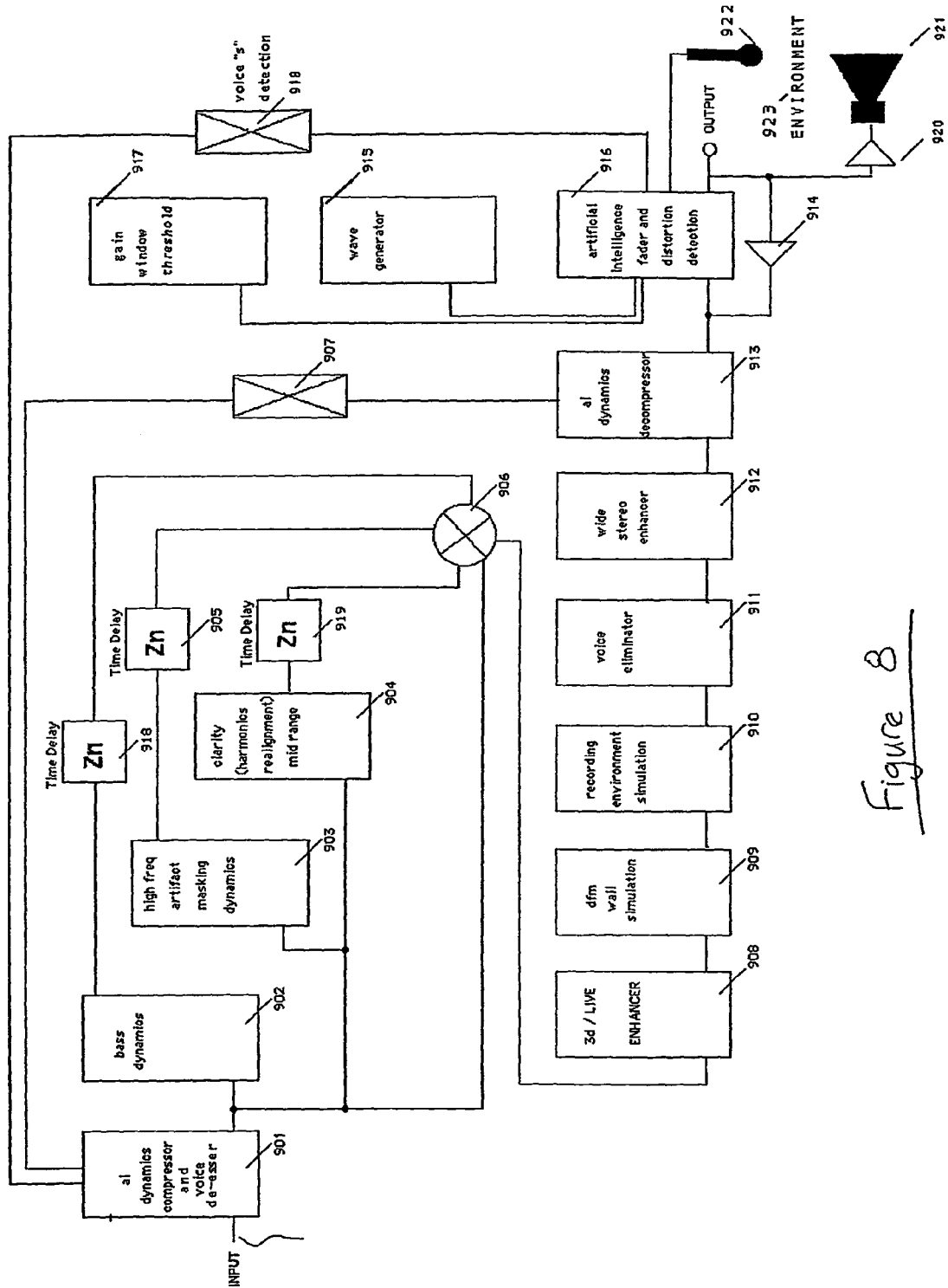
FIG. 8 is a block diagram illustrating signal processing functions for enhancing audio signals, in accordance with another preferred embodiment.

FIG. 8 is a block diagram illustrating an alternative embodiment of the enhancement processor according to the disclosed method/system. The system depicted in FIG. 8 includes many of the same elements depicted in FIG. 4 and also operates in the same manner as described above. It should be noted, however, that FIG. 8 includes the following additional elements: a bass dynamics processor 902; time delay elements 905, 918 and 919; a DFM wall simulator 909; an offset device 907; a wave generator 915; a gain window threshold processor 917 and a voice "s" detection circuit 918. Also depicted in FIG. 8 are a speaker 921 (with an accompanying amplifier 920) and a microphone 922. The bass dynamics processor 902 comprises a special filter combined with a variable time delay circuit and compressor and expander blocks to enhance a dynamic bass sound. The wall simulator 909 performs the same functions as described above with respect to the previous figures. In embodiments deployed on X86-compatible processors (PCs and derivative devices), the wave generator 915 is used to prevent Intel FPU "denormal" operation during periods of silence. The offset device 907 is used to allow communications between the AI dynamics compressor 901 and the AI dynamics decompressor 913. It should also be noted that the AI fader and distortion detection device 916 can be used to monitor the listening environment 923 and provide feedback so that an appropriate gain level can be applied to the output signal. This can be performed through the use of a Fletcher-Munson look-up table.

FIGS. 9-16 illustrate various aspects of another preferred embodiment of the invention that can be implemented at a client-side processing component such as a personal computer or other device capable of processing digital audio files for playback to a user.

Figure 9:
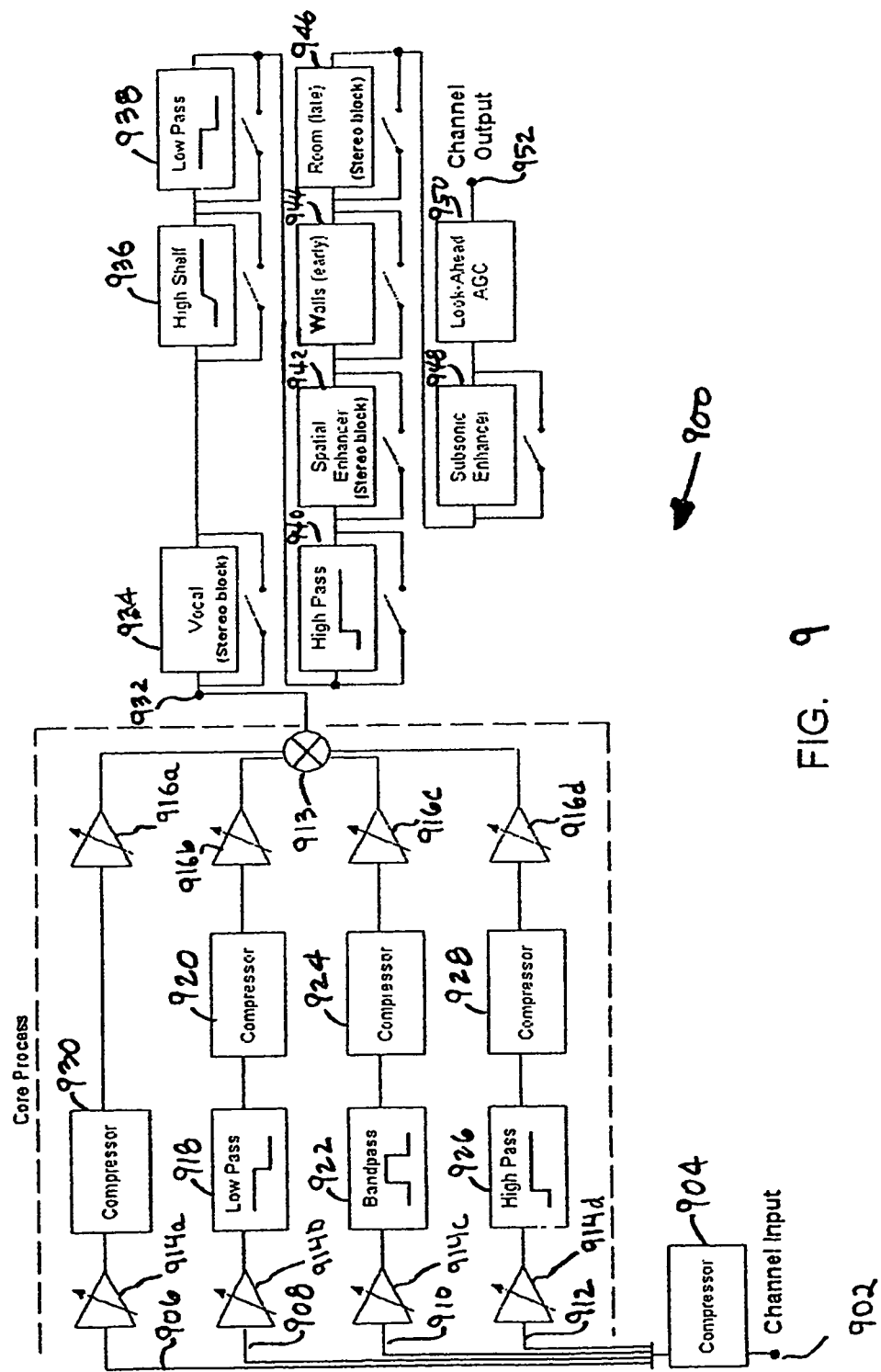
FIG. 9 is a block diagram illustrating signal processing functions associated with client-side enhancement of limited bandwidth music, in accordance with a preferred embodiment.

FIG. 9 is a block diagram illustrating signal processing functions associated with client-side enhancement of limited bandwidth music, in accordance with a preferred embodiment. In a practical embodiment, the architecture 900 depicted in FIG. 9 can be realized in hardware, software, firmware, or any combination thereof. While only one channel of processing is shown in FIG. 9, it should be appreciated that multiple processing channels may be so employed. For example, although a single channel, mono channels, or stereo channels are described, herein, multiples of these described channels may be employed to provide additional functionality and sound processing, as needed. Further, within a channel, although a specific number of pathways may be described herein, it is to be understood that fewer or more such pathways may be employed within the spirit of this invention.

Further, the below-described decoding and enhancement processes are preferably software routines running on a processor, and therefore references to signal paths refer to common programming techniques of passing data from one routine to another. Thus, consistent with the preferred embodiment, a signal path or pathway is not intended to refer to a physical connection; however, distinct connections may be used in some practical embodiments.

The enhancement process starts with the audio signals outputted from the reception codec. Initially, the signal is directed through a channel input 902 to a compressor 904. The compressor 904 is preferably a standard audio limiter, i.e., a processing function that keeps the louder sections of the sound from overwhelming the downstream processing due to lack of dynamic range. In response to the sound levels, the compressor 904 makes gain changes which may have a coloring effect on the sound, such as "pumping" and "clipping." Changes in gain, which occur as the result of limiting or decompression, are often noticeable by the listener, and this is referred to as "pumping." "Clipping" occurs when the signal exceeds the maximum possible value available in a system.

The output of the compressor 904 splits the signal into a plurality of discrete pathways or bands, at least one of which corresponds to a full bandwidth signal. In the preferred embodiment, the output of the compressor 904 is directed to four streams. They are referred to as the full bandwidth pathway 906, the bass pathway 908, the midrange pathway 910, and the treble pathway 912. Each pathway is preferably processed independently. The full bandwidth pathway 906 is for the full-bandwidth sound to reach an output mixer 913. In contrast with the processing of the various filtered bands discussed below, the full bandwidth pathway 906 is preferably not sound-level decompressed. The bass, midrange, and treble pathways 908/910/912 preferably filter the signal into non-overlapping frequency bands.

It should be appreciated that more or fewer pathways may be employed. For example, there may be an additional pathway for a sub-woofer band and the mid-frequency band may be divided into two separate mid-frequency bands. When the number of frequency bands used in an alternate embodiment is very high, the filtering may be provided by an ARBI filter. For example, the compressor 904 may be an ARBI filter having three hundred stereo channels for dynamic, parametric filtering.

Prior to processing, the respective inputs of the full bandwidth, bass, midrange, and treble pathways 906/908/910/912 are amplified by respective variable gain amplifiers 914*a-d*. In a practical embodiment, each of the variable gain amplifiers employed by the processing architecture 900 has an adjustable gain between −30 dB and +25 dB, with an adjustment resolution of 0.1 dB. In operation, a number of settings and/or adjustable features of the processing architecture, including the adjustable gain settings of the amplifiers 914, may be determined according to the requirements of other processing functions described herein which are performed in connection with the operation of the present invention. After processing, the respective outputs of the full bandwidth, bass, midrange, and treble pathways 906/908/910/912 are amplified by variable gain amplifiers 916*a-d* and then combined at the mixer 913.

Each frequency band formed by the filters is processed independently by the various processing elements shown in FIG. 9 and described in more detail below. A specific, programmable, sound-level expansion or compression for each frequency band is carried out by dynamic processing elements included in each of the bass, midrange, and treble pathways 908/910/912. Such processing elements preferably comprise various filters together with an expander and/or compressor. For example, the bass pathway 908 preferably includes at least a low pass filter 918 and a compressor 920. The midrange pathway 910 preferably includes at least a bandpass pass filter 922 and a compressor 924. The treble pathway 912 preferably includes at least a high pass filter 926 and a compressor 928. In the example embodiment, the full bandwidth pathway 906 includes a compressor 930 and need not utilize any filtering elements. It should be appreciated that the processing elements used in each pathway can vary depending on the number and type of bands associated with the pathway as well as other design choices.

As mentioned above, the processed signal corresponding to each band pathway serves as a respective input to the mixer 913. The mixer 913 provides a signal balance among the four pathways, and directs the mixed signal 932 to a number of selectable (i.e., capable of being bypassed) or optional processing elements. FIG. 9 depicts a preferred ordering of these processing elements. Alternate embodiments of the invention, however, may utilize a different ordering of such processing elements and/or employ additional or alternative processing elements.

In the example embodiment, the mixed signal 932 serves as an input to a vocal enhancer element 934, which is suitably configured to enhance voices and solo instruments in the time domain without additional frequency domain coloring or overtone unbalancing with relation to the fundamental frequencies of the solo instruments or vocal materials in the stereo waveform. One example vocal enhancer element is described in more detail below in connection with FIG. 10. The output of the vocal enhancer element 934 is then (optionally) passed through highly equalized resonant filters to reinforce the subwoofer and bass frequencies. Such filters preferably comprise a high-shelf filter 936, a low pass filter 938, and a high pass filter 940. The high-shelf filter 936 emphasizes the range of frequencies above a given "crossover" frequency. The "steepness" of the crossover is adjustable by varying the "Q" or quality factor of the filter.

The filtered output signal may be directed to a spatial enhancer element 942, which is configured to provide a widened soundstage to the listener. The spatial enhancer element 942 removes "equal energy" (common-mode) signal content from the stereo signal (usually solo vocals and instruments), delays it, then re-mixes it with the raw signal using a combination of frequency and time-domain functions. This provides a "widened" sound stage to the listener without delocalizing the equal-energy material.

Figure 11:
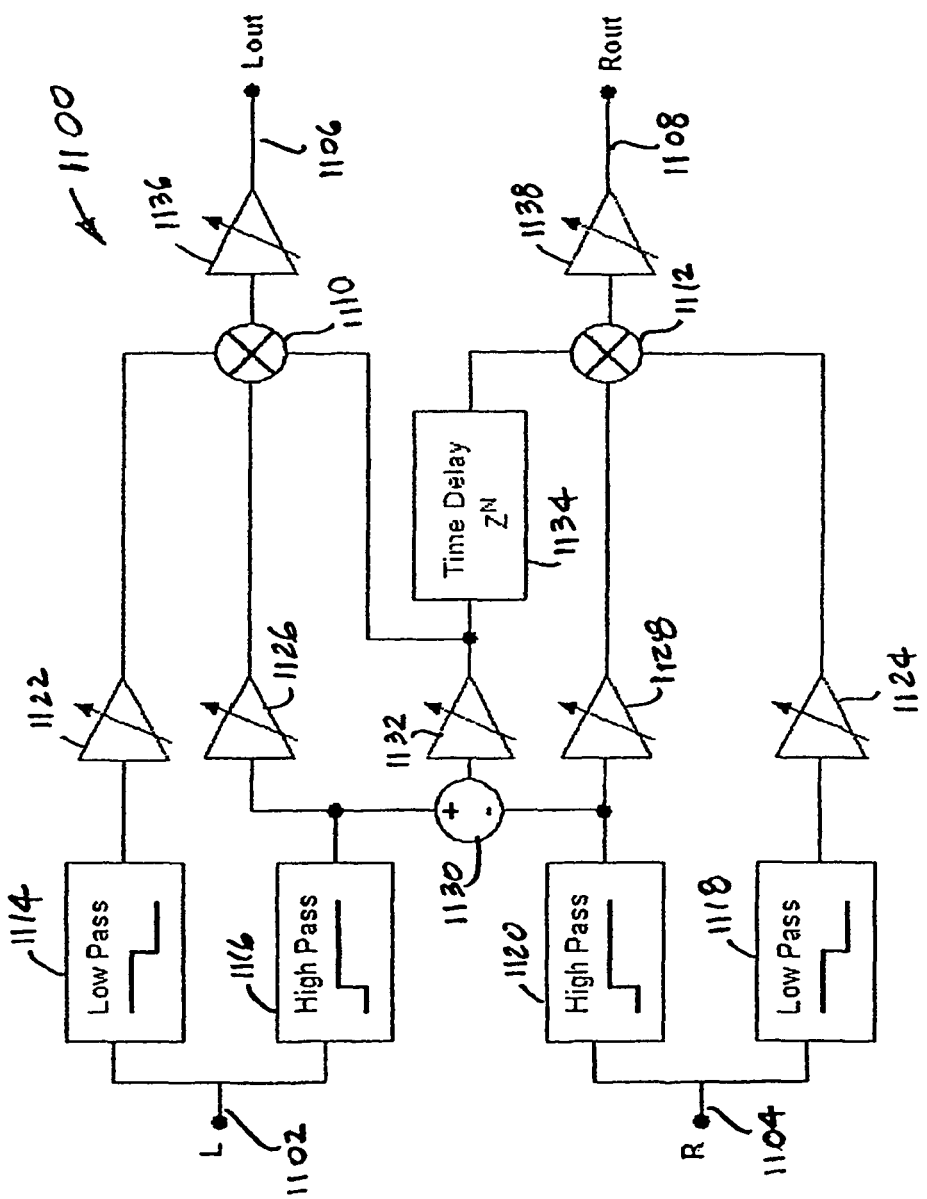
FIG. 11 is a schematic representation of an example spatial enhancer element suitable for use with the architecture depicted in FIG. 10.

One example spatial enhancer element is described in more detail below in connection with FIG. 11. In the example embodiment, the output of the spatial enhancer element 942 serves as an input to a walls simulator element 944. The walls simulator element 944 preferably uses diffuse-field matrix (DFM) techniques to produce time delays simulating the reflections from an actual stage. Simulation of such a sound-reflecting environment can add a liveliness, or reverb quality to the music, without introducing unwanted resonant peaks. One example walls simulator element is described in more detail below in connection with FIG. 12.

Conventional DFM techniques use number theory algorithms for non-harmonic, non-resonant wave reflection. For example, the quadratic residues described in Section 15.8 and the primitive roots described in Section 13.9 of Number Theory in Science and Communication, by M. R. Schroeder, Springer-Verlag, Berlin, Second Edition (1986), can be applied in this context. Those conventional techniques only, however, provide for long-time reflections that would simulate the "reverb" of a room. A primitive root calculation, which improves upon the methods taught by Schroeder by applying a "diffuse field matrix" ("DFM") technique so as to provide for early reflections of the sound, i.e., reflections within 5 to 30 milliseconds of the direct sound, is preferably employed.

The walls simulator element 944 can also help to break-up, re-shape, or remove the unwanted effects of strong periodic processing artifacts or troublesome periodic features. The DFM techniques used in the stage simulator do not use regeneration, i.e., feedback from the output to the input of this processing element. Control parameters of this processing stage include the size and distance from the wall.

In the example embodiment, the output of the walls simulator element 944 is directed to a room simulator element 946. One example room simulator element is described in more detail below in connection with FIG. 13. The room simulator element 946 uses DFM techniques to produce time delays and resonances that are similar to natural room acoustics. The DFM techniques are similar to those used in the walls simulator element 944, but use regeneration. The room simulator element 946 can add reverb and decay, or can add DFM without reverb, to enhance dry musical material, and further obscure subtle codec-induced distortions. Other parameters of this processing stage include room size, room aspect ratios, and the wet/dry mix (where "dry" refers to a lack of effects and "wet" refers to the use of effects). Another use of the room simulator element 946 is to compensate for poor room acoustics in the listener's listening environment. The same DFM techniques used for adding natural room or stage acoustics to a dry signal, as described above, can also be used to de-emphasize resonances or filtering in the listener's room, and to provide for a reduction in the room's perceived ambient noise level.

Various filters may be applied based on the qualities of the client site or listening room, which may be measured and compensated for by the room simulator element 946. One filter may compensate for the acoustics of the listening room, which is based on a transform function, $R(\omega)$, having a number of resonances. If much of the room has soft surfaces, such as carpet, drapes, or cushioned furniture, then it is likely that the room transform $R(\omega)$ will fall off at high frequencies. However, if the listening room has many hard surfaces, then it is likely that the high frequency end of the room transform $R(\omega)$ will not fall off to such a degree.

Further enhancement may be obtained by compensating for the environment in which the music was recorded, or a simulated recording environment (which may actually differ from the environment in which the music was recorded). The client is given a choice of multiple recording environments. According to the preferred embodiment, the following ten simulated recording environments may be selected by a client: audio studio, jazz session, nightclub, game space, bass jam, theater, rock concert, sonic wide, symphony, or cathedral. For instance, in a studio environment there will be an enhancement of early reflections (DFM). Or, in a simulated hall environment there will be short reverb times, while a simulated stadium will have considerably longer reverb times. In a sense, the user becomes a "producer" in that the user simulates how the music was recorded. Alternatively, the application of simulated recording environments may be based solely on the actual environment in which the music was recorded, rather than the user's preference. In this case, the system would correct for unwanted artifacts from the recording, and downloaded or streamed files may include a tag, such as the ID3 tag of MP3 files, which will identify the appropriate recording room acoustics.

The output of the room simulator element 946 is connected to a subsonic enhancer element 948, which is suitably configured to provide low-bass reinforcement of the signal. One example subsonic enhancer element is described in more detail below in connection with FIG. 14.

The output of the subsonic enhancer element 948 is connected to a look-ahead automatic gain control (AGC) element 950. The look-ahead AGC element 950 is suitably configured to provide control of the output dynamic range of the entire process. The "look-ahead" terminology refers to the delay of the signal, which gives the control amplifier enough time to change gain smoothly, without introducing transients, or "pumping" in the output. This feature operates to lower the audio level during peak events and then return it after a peak event has passed. To keep sound from distorting during the listening process or while recording it, a human engineer would always drop the volume, by moving the volume control down of the offending instrument or vocal. By essentially simulating a human engineer, the look-ahead AGC element 950 rapidly moves the audio level down by analyzing the digital stream for distortion and signal overloads to identify peak events. It then returns the volume towards the initial volume setting after the peak event has occurred, without the need for an "always-on" audio compressor circuit, which undesirably leads to a loss of dynamic edge and flat sound.

One example look-ahead AGC element is described in more detail below in connection with FIG. 15. Notably, the look-ahead AGC element 950 may include one or more delay elements (not shown) that compensate for different time delays that the various processing elements may generate, or which may have been produced during recording or processing at the server side. Typically, the time delay for proper alignment will be on the order of microseconds.

In this example embodiment, the look-ahead AGC element 950 is the final stage of enhancement processing and provides the enhanced signal to a channel output 952, which, in turn, connects to the speaker driver circuitry. The speaker driver circuitry converts the processor's enhanced digital representation of the signal into a hardware analog signal, and provides the necessary amplification and connectivity to the speaker.

The preferred ordering of the individual processing components (between the mixer 913 and the channel output 952) is shown in FIG. 9. Practical embodiments, however, may employ a different ordering of such components as necessary to suit the needs of the particular application or to meet the demands of the particular listener. Furthermore, additional and/or alternative processing elements may be utilized in alternate embodiments of the invention.

The sound-level decompression described herein provides a widening of the dynamic range of the music to help correct for compressions of the audio signal that have occurred at any time from the recording of the original audio source onwards. Typically, the recording and mixing of music includes sound-level compression of many of the tracks so as to take advantage of the limited dynamic range of the recording medium. Also, some form of compression may be applied post-recording, to reduce the bandwidth for Internet broadcast purposes. This latter type of compression may be substantially removed by the reception codec, but may have been insufficiently corrected for, or otherwise be in need of further expansion to improve the "liveness," or other subjective qualities, of the music. A processing feature using dynamics with different time constants and expansion factors for each emphasis band is preferably employed.

The various processing elements shown in FIG. 9 may be controlled by a master control program that can bypass any of the processes, and can specify the parameters of each process. The "skin" is the interface which allows the client to control parameters and presets, i.e., the "skin" is the visual and interactive part of the enhancement program displayed on the listener's PC screen. Fader controls are available for the listener to specify each parameter in the system, and "radio buttons" (i.e., on/off switches) are available to select groups of preset parameters. The enhancement parameters may be adjusted separately, or various presets may be chosen.

The system may include a "bigness" control that simultaneously controls the parameters of the individual band processors. For low values of the "bigness" parameter, less dynamic processing occurs, and the sound-level dynamic range is equal to that of the music as recorded. For high values of the "bigness" parameter, each band's processing dynamics are increased relative to the sound-level dynamic range of the recorded music.

Preset parameter groups are of two types: listener defined and built-in. Listeners can select presets from their own previously labeled groups, or can select from a menu of built-in presets. Built-in presets are designed based on considerations of bandwidth, codec type, listeners' speakers, and music type. Once a listener selects a built-in preset, the listener may then adjust any individual parameter or group of parameters to customize the built-in preset. That adjusted group of parameters can then be labeled and saved as a new preset. For example, if a built-in preset is selected, then the listener may subsequently select a group of room-compensation parameters that may be applied to the selected built-in preset.

Figure 10:
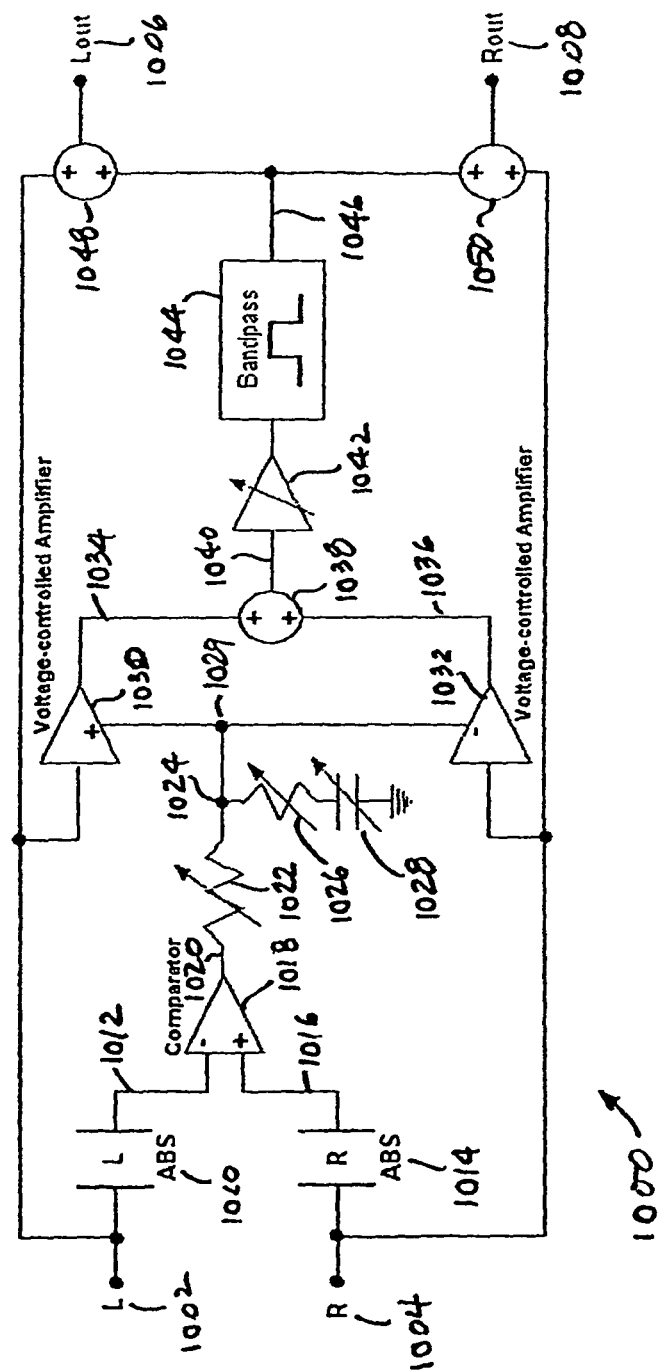
FIG. 10 is a schematic representation of an example vocal enhancer element suitable for use with the architecture depicted in FIG. 1.

FIG. 10 is a schematic representation of an example vocal enhancer element 1000 suitable for use with the architecture depicted in FIG. 9. The vocal enhancer element 1000 clarifies vocals in the recording without adversely affecting the primary fundamental frequencies that give voices depth and fullness. In operation, a number of settings and/or adjustable features of the vocal enhancer element 1000 may be determined according to the requirements of other processing functions described herein which are performed in connection with the operation of the present invention.

The vocal enhancer element 1000 is a stereo processing component—it receives a left input signal 1002 and a right input signal 1004, and produces a corresponding left output signal 1006 and a corresponding right output signal 1008. The left channel input signal 1002 is routed to an absolute value generator 1010, which generates an output signal 1012 that represents the absolute value of the left input signal 1002. The right channel input signal 1004 is routed to an absolute value generator 1014, which generates an output signal 1016 that represents the absolute value of the right input signal 1004. In other words, the left and right channel input signals are full-wave rectified. A comparator 1018 receives the two output signals 1012/1016 and produces a difference signal 1020 that represents the output signal 1012 subtracted from the output signal 1016. The voltage of the difference signal 1020 is proportional to the differences between the left and right inputs.

The derived difference voltage is then filtered to remove fast transients, becoming a control voltage. The output of the comparator 1018 is connected to one end of a variable resistance 1022. The second end of the variable resistance 1022 is connected to (or corresponds to) a node 1024. The first end of another variable resistance 1026 is also connected to node 1024. The second end of the variable resistance 1026 is connected to the first end of a variable capacitance 1028, and the second end of the variable capacitance 1028 is connected to a reference voltage, e.g., ground. The variable resistance 1022, the variable resistance 1026, and the variable capacitance 1028 can be independently adjusted to provide a suitable level and cross over frequency. These variable components from an adjustable low pass filter arrangement that conditions the difference signal 1020 into a suitable control signal 1029 present at node 1024.

The left input signal 1002 also serves as an input to a first voltage controlled amplifier 1030, and the right input signal 1004 also serves as an input to a second voltage controlled amplifier 1032. The differential nature of the voltage controlled amplifiers equalizes the signal amplitude of the left and right channel audio levels over time. The control signal 1029 adjusts the gain of the two voltage controlled amplifiers 1030/1032—the output signal 1034 of the voltage controlled amplifier 1030 represents an amplified version of the left input signal 1002 and the output signal 1036 of the voltage controlled amplifier 1032 represents an amplified version of the right input signal 1004. These two output signals 1034/1036 are fed into a summer 1038, which produces a summed output signal 1040. The summer 1038 effectively removes any opposite-phase material, and creates a synthesized "vocal" or "center" channel. This takes advantage of the fact that most vocal tracks are mixed with equal energy into the left and right channels when originally recorded. The summed output signal 1040 serves as an input to an adjustable gain amplifier 1042, to provide a suitable signal level. The output of amplifier 1042 is then processed by a band pass filter arrangement 1044 to produce a filtered signal 1046. The band pass filter arrangement 1044 removes bass and treble content outside of the desired vocal range.

The left input signal 1002 also serves as an input to a summer 1048, and the right input signal 1004 also serves as an input to a summer 1050. The summer 1048 generates the sum of the left input signal 1002 and the filtered signal 1046; this sum represents the left output signal 1006. The summer 1050 generates the sum of the right input signal 1004 and the filtered signal 1046; this sum represents the right output signal 1008. These summers 1048/1050 mix the vocal output with the original left and right channel signals, thus emphasizing the vocal content of the source material.

The spatial enhancer element creates a complex sound field enhancement by stripping common-mix material from the stereo signal, then mixing the result back into the left channel directly, and the right channel with an appropriate delay. Bass content is removed from the original signals before processing, then re-applied in the "final" left and right channel mixers, thus preventing low frequency bass energy from compromising the effectiveness of the "stripper" circuit. FIG. 11 is a schematic representation of an example spatial enhancer element 1100 suitable for use with the architecture depicted in FIG. 9. In operation, a number of settings and/or adjustable features of the spatial enhancer element 1100 may be determined according to the requirements of other processing functions described herein which are performed in connection with the operation of the present invention.

The spatial enhancer element 1100 is a stereo processing component—it receives a left input signal 1102 and a right input signal 1104, and produces a corresponding left output signal 1106 and a corresponding right output signal 1108. One mixer 1110 is associated with the left output signal 1106, while another mixer 1112 is associated with the right output signal 1108.

The left input signal 1102 is passed through a low pass filter 1114 and a high pass filter 1116. In the example embodiment, the low pass filter 1114 is realized as a second order filter having an adjustable cutoff frequency that is typically set at approximately 300 Hz. This filter is utilized to isolate the low frequency content such that it does not unbalance the spatial enhancer element 1100 or generate undesirable artifacts. In the example embodiment, the high pass filter 1116 is realized as a second order filter having an adjustable cutoff frequency that is typically set at approximately 300 Hz. Similarly, the right input signal is passed through a low pass filter 1118 and a high pass filter 1120. In the preferred embodiment, the characteristics of the low pass filter 1118 match the characteristics of the low pass filter 1114, and the characteristics of the high pass filter 1120 match the characteristics of the high pass filter 1116.

The outputs of the low pass filters 1114 and 1118 are respectively passed through a variable gain amplifier 1122 and a variable gain amplifier 1124, the outputs of which are respectively directed into mixer 1110 and mixer 1112. Similarly, the outputs of the high pass filters 1116 and 1120 are respectively passed through a variable gain amplifier 1126 and a variable gain amplifier 1128, the outputs of which are respectively directed into mixer 1110 and mixer 1112. In a practical embodiment, each of the variable gain amplifiers employed by the spatial enhancer element 1100 has an adjustable gain between −30 dB and +25 dB, with an adjustment resolution of 0.1 dB. The outputs of the high pass filters 1116 and 1120 are also used as inputs to a subtractor 1130. The output of the subtractor 1130 represents the output of the high pass filter 1116 minus the output of the high pass filter 1120. This operation effectively phase-cancels any material common to both channels. This creates the "stripped" signal. The output of the subtractor 1130 is then directed toward a variable gain amplifier 1132. The output of the variable gain amplifier 1132 serves as an additional input to mixer 1110, as well as an input to a time delay element 1134.

The time delay element 1134 is configured to introduce a delay of between 0.05 ms to 30 ms (e.g., 1 to 1440 samples at a sampling frequency of 48 kHz). In operation, the specific amount of delay may be determined according to the requirements of other processing functions described herein which are performed in connection with the operation of the present invention. The time delay simulates a spatial function related to the distance between the listener's ears. In practical implementations, the time delay should not exceed approximately 2.2 ms. In one preferred embodiment, the time delay is about 1.1 ms. The output of the time delay element 1134 serves as an additional input to the mixer 1112.

The mixer 1110 functions as a summer to combine its input signals. In practice, the mixing results in a more complex sound field and spatial displacement having a wider stereo image. Thus, the spatial enhancer element 1100 emphasizes discrete left and right channel content and remixes that content with the original signal content. The mixer 1112 functions in a similar manner. The output of the mixer 1110 serves as an input to a variable gain amplifier 1136, the output of which represents the left channel output signal 1106. The output of the mixer 1112 serves as an input to a variable gain amplifier 1138, the output of which represents the right channel output signal 1108. The left and right output signals 1106/1108 can be routed to additional processing elements utilized in the architecture, such as the walls effect element 944 (see FIG. 9).

The Wall Effect element is used to add artificial early reflections to the signal, simulating the effect of nearby reflective surfaces close to the performance source. No regeneration is used with this element. In the example embodiment, the signal path may be summarized as follows:

Predetermined "tap" points are created in a circular delay line by calculating the distribution of primitive roots across a reflective surface.

The signal is low-pass filtered to approximate the frequency response of the desired reflective surface.

The filtered signal is applied to the circular delay line.

The delayed signal is "tapped" at the predetermined tap points down the delay line. The tapped values are summed in decreasing amplitude, approximating the effect of air losses over distance points along the reflective surface.

The synthesized reflective "wet" signal is mixed in ratio with the original "dry" signal to provide the block output.

Figure 12:
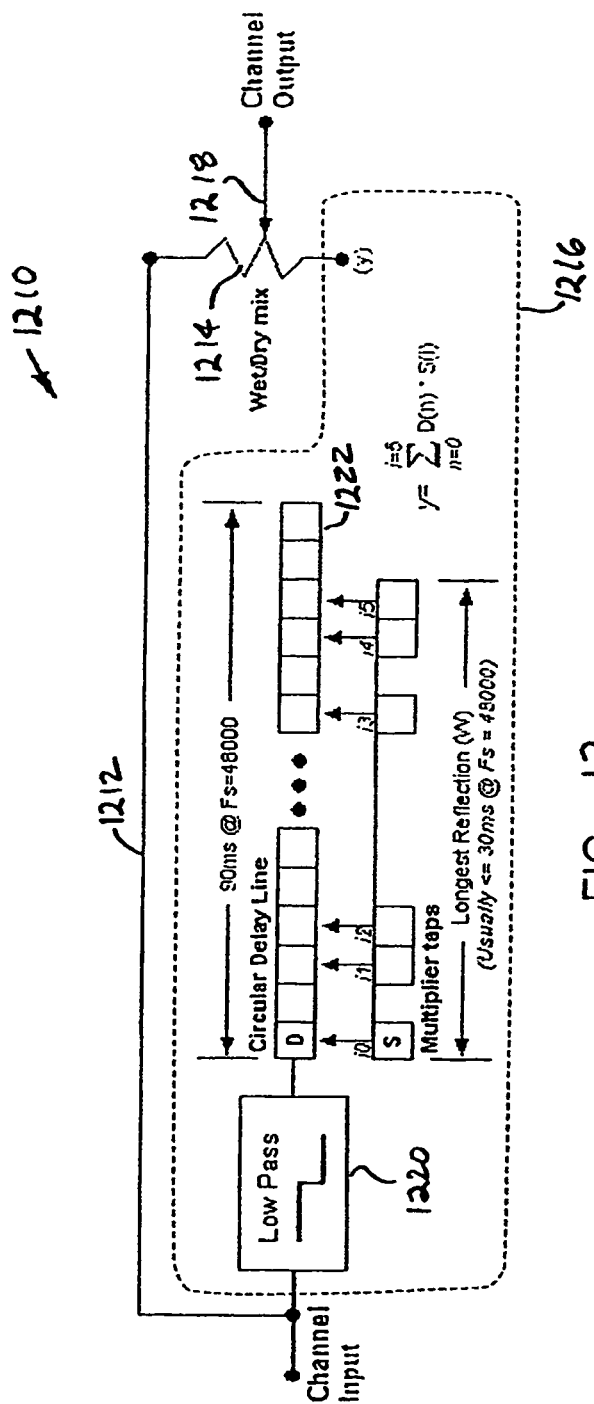
FIG. 12 is a schematic representation of an example Wall Effect element suitable for use with the architecture depicted in FIG. 10.

FIG. 12 is a schematic representation of an example Wall Effect element 1210 suitable for use with the architecture depicted in FIG. 9. The Wall Effect element 1210 uses diffuse-field matrix (DFM) techniques to produce time delays simulating the reflections from an actual stage. Simulation of such a sound-reflecting environment can add a liveliness, or can add diffuse field matrix type energy without reverb to add a "live" quality to the music, without introducing unwanted resonant peaks.

Conventional DFM techniques use number theory algorithms for non-harmonic, non-resonant wave reflection. For example, the quadratic residues described in section 15.8 and the primitive roots described in Section 13.9 of Number Theory in Science and Communication, by M. R. Schroeder, Springer-Verlag, Berlin, 1986, 2nd Edition can be applied in this context. Those conventional techniques only, however, provide for long-time reflections that would simulate the "reverb" of a room. A primitive root calculation, which improves upon the methods taught by Schroeder by applying a diffuse field matrix DFM technique so as to provide for early reflections of the sound, i.e., reflections within 5 to 30 milliseconds of the direct sound, is preferably employed.

The Wall Effect element 1210 can also help to break-up, re-shape, or remove the unwanted effects of strong periodic processing artifacts or troublesome periodic features. The DFM techniques used in the stage simulator do not use regeneration, i.e., feedback from the output to the input of this processing element. Control parameters of this processing stage include the size and distance from the wall.

Referring to FIG. 12, an implementation of Wall Effect element 1210 will now be described. It is to be understood that while wall effect processing for a single channel is illustrated in FIG. 12, for a stereo effect, two such channels may be used.

The channel input follows two paths: a direct path 1212 to an input of wet/dry mixer 1214, and a filter, delay and summing path 1216, the output of which is applied to another input of wet/dry mixer 1214. The output of Wall Effect element 1210 can be adjusted to provide different ratios or proportions of information from the direct path 1212 and the processed path 1216, as indicated by arrow 1218.

Along path 1216, each incoming sample is applied to a low pass filter 1220. Then the filtered sample is applied to a circular delay line 1222. As can be seen from FIG. 12, n-multiplier taps may be employed at different points in the delay line 1222, to form the sum:

$$y = \sum_{n=0}^{i=x} D(n) * S(i)$$

where the number of taps equals x+1, D(n) represents the delayed sample n, and S(i) represents the coefficient to be applied to the product. The value of x will be governed by the amount of available processing power in a practical implementation. Thus, the sum of D*S is formed for all positions of multiplier taps. As a part of the operation, the position indexes for the multiplier taps are shifted to the right, and, should the position index run past the end of the delay line, the position indexes are wrapped around to the beginning of delay line 1222. The output of this summing operation is the sum "y" which is applied to one of the inputs to wet/dry mixer 1214.

In the example of the Wall Effect element 1210 provided in FIG. 12, the total length of circular delay line 1222 may be 90 msec at a sample rate of Fs=48 kHz, and there may be six (x=5) multiplier taps. Also, the longest reflection (W) may be less than or equal to 30 msec at a sample rate of Fs=48 kHz. The length of the W axis influences the "size" of the wall effect. Also, the "mix" of the wall effect is a function of the wet/dry ratio set (symbolically) by arrow 1218.

It is to be understood that as implemented in FIG. 12, Wall Effects element 1210 is not a finite impulse response filter (FIR) since a complete convolution is not performed.

The output of the Wall Effect element 1210 may be directed to the room effects element 1310.

Figure 13:
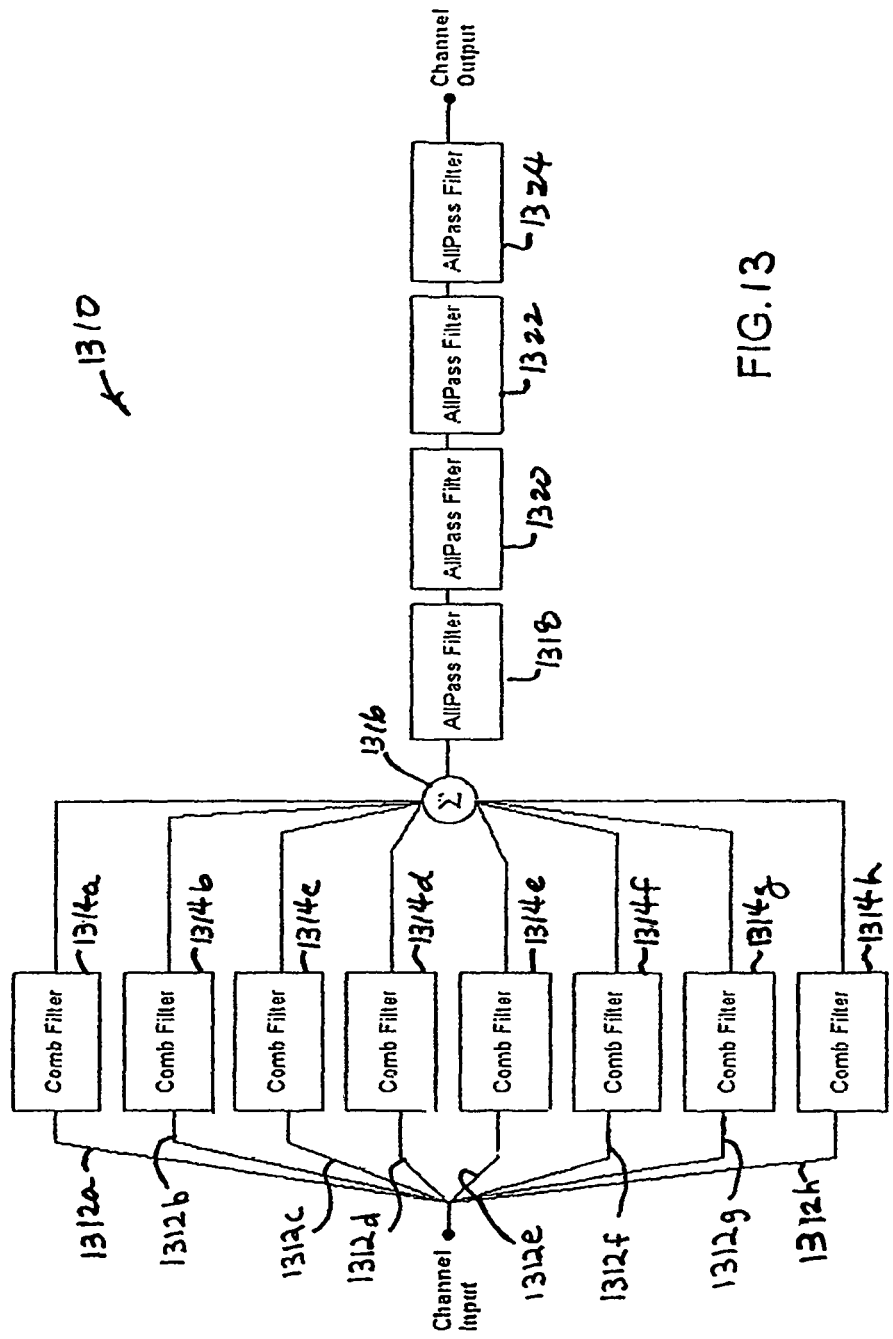
FIG. 13 is a schematic representation of an example Room Effect element suitable for use with the architecture depicted in FIG. 10.

FIG. 13 is a schematic representation of an example Room Effect element suitable for use with the architecture depicted in FIG. 9. Referring to FIG. 13, an implementation of Room Effect element 1310 will now be described. While one section of a room effect element implementation is shown in FIG. 13, it is to be understood that two or more such sections may be used for a stereo or multichannel embodiment.

The room effects element 1310 uses DFM techniques to produce time delays and resonances that are similar to natural room acoustics. The DFM techniques are similar to those used in the Wall Effects element 1210, but use regeneration. The room effects element 1310 can add reverb and decay to enhance dry musical material, and further obscure subtle codec-induced distortions. Other parameters of this processing stage include room size, room aspect ratios, and the wet/dry mix. The room effects element 1310 is used to add artificial "late" reflections to the signal, simulating the ambient reflectivity of a real room environment. The example embodiment uses a combination of eight hand-tuned comb filters in parallel, feeding four all-pass filters in series. The synthesized reflective "wet" signal is mixed in ratio with the original "dry" signal to provide the output.

Further enhancement may be obtained by compensating for the environment in which the music was recorded, or a simulated recording environment (which may actually differ from the environment in which the music was recorded). The client is given a choice of multiple recording environments. According to the preferred embodiment, the following ten simulated recording environments may be selected by a client: audio studio, jazz session, nightclub, game space, bass jam, theater, rock concert, sonic wide, symphony, cathedral. For instance, in a studio environment there will be an enhancement of early reflections. Or, in the "night club" environment there will be short reverb times, while a "cathedral" will have considerably longer reverb times. In a sense, the user becomes a "producer" in that the user simulates how the music was recorded. Alternatively, the application of simulated recording environments may be based solely on the actual environment in which the music was recorded, rather than the user's preference. In this case, the system would correct for unwanted artifacts from the recording, and downloaded or streamed files may include a tag, such as the ID3 tag of MP3 files, which will identify the appropriate recording room acoustics.

The implementation of Room Effect element 1310 illustrated in FIG. 13 employs a multiplicity of parallel paths (eight (8) such paths 1312a-h in this example) each being processed by a comb filter 1314a-h, respectively. The outputs of each of these comb filters 1314 are then summed in summer 1316, and then applied to several all-pass filter blocks 1318, 1320, 1322, and 1324. Each of the comb filters 1314 is parameterized individually to provide a different amount of reverb enhancement to reduce the amount of "metallic" or "tinny" artifacts that are typically produced by conventional processing techniques. The parameters of the all-pass filter blocks 1318, 1320, 1322, and 1324 are adjusted such that their phase characteristics also contribute to the reduction of such "metallic" or "tinny" artifacts. In practical embodiments, the comb filters and all-pass filters may be hand-tuned by an experienced sound engineer to provide the desired output signal characteristics.

Following the processing of the sound signals in room effect element 1310, the signals proceed to the subsonic enhancer element.

In the example embodiment, the subsonic effect element uses a combination of an adjustable-Q low-pass filter and a compressor to provide low-bass reinforcement of the signal. The subsonic effect element may have the following features and/or characteristics:

The low-pass filter edge frequency and "Q" are both adjustable to provide either a smooth or "humped" response in the frequency domain.

The compressor raises the average energy of the bass signal by tracking the amplitude over time. High energy material is limited, and low energy material is amplified, raising the average energy.

The filtered "wet" signal is gain-controlled, then summed with the original "dry" signal to provide variable control of the block output.

Figure 14:
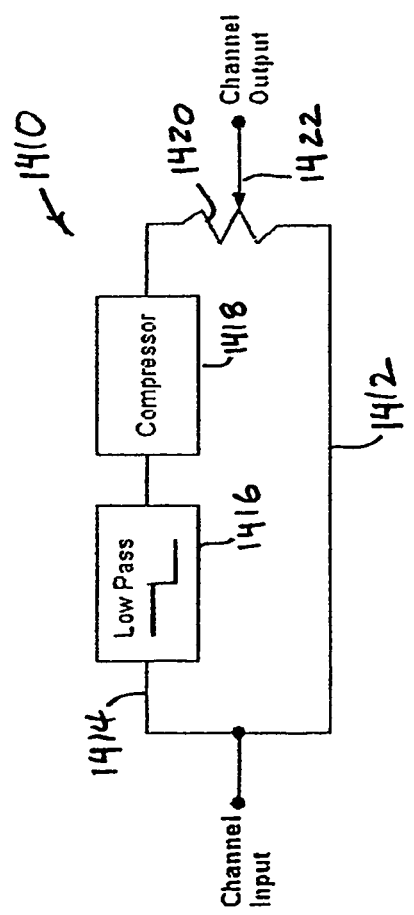
FIG. 14 is a schematic representation of an example Sub-Sonic Effect element suitable for use with the architecture depicted in FIG. 10.

FIG. 14 illustrates a functional block level implementation of subsonic effect element 948 of FIG. 9. In FIG. 14, although a single channel is illustrated, it is to be understood that two such sections may be used for a stereo presentation. In the preferred embodiment of the invention, the subsonic effect function 1410 is implemented by combining versions of the channel input signal which have propagated down two paths: (1) a path 1412 with no filtering or compression so that the original channel input sound is preserved, and (2) a path 1414 over which the sound is filtered and compressed, preferably with a low pass filter 1416 and a compressor 1418, respectively. These two signals are preferably summed, as depicted by summing element 1420, to provide the channel output for the subsonic effect element 1410. It is to be noted that in the summing element 1420, the arrowhead 1422 indicates that the element may be operated to provided a selectable ratio of the filtered/compressed signal to the unfiltered/uncompressed signal, to enhance or reduce the amount of lower frequency components of the channel input signal.

Preferably, the filter characteristics of low pass filter 1416 and of compressor 1418 are determined according to the processing requirements of other processing functions described herein which are performed in connection with the operation of the present invention.

As described in connection with FIG. 9 above, the Look-Ahead AGC element 950 provides a look-ahead automatic gain control function. This feature operates to lower the audio level during peak events and then return it after a peak event has passed. To keep sound from distorting during the listening process or while recording it, a human engineer would always drop the volume, by moving the volume control down of the offending instrument or vocal. By essentially simulating a human engineer, the Look-Ahead AGC element 950 rapidly moves the audio level down by analyzing the digital stream for distortion and signal overloads to identify peak events. It then returns the volume towards the initial volume setting after the peak event has occurred, without the need for an "always-on" audio compressor circuit, which undesirably leads to a loss of dynamic edge and flat sound. In the example embodiment, the signal path may be summarized as follows:

The signal is applied to a circular delay line.

The signal is full-wave rectified, and the resultant value is measured against the "target" amplitude (the target amplitude represents the maximum signal value for the desired dynamic range).

If the rectified signal exceeds the target value, the gain of the control amplifier is decreased by a predetermined "negative ramp" value.

If the rectified signal is less than the target value, the gain of the control amplifier is increased by a predetermined "positive ramp" value.

The output signal sample is taken from an earlier position in the delay line and applied to the control amplifier. The amplified signal becomes the output of the block.

Figure 15:
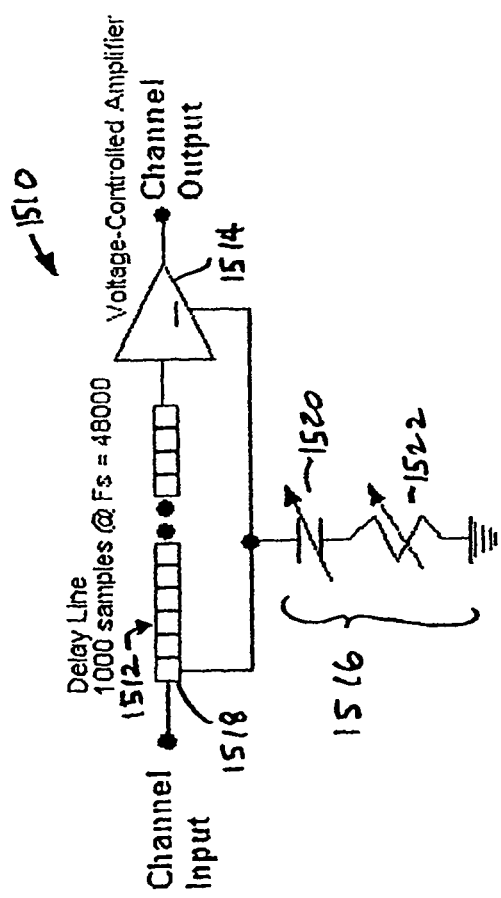
FIG. 15 is a schematic representation of an example Look-Ahead AGC element suitable for use with the architecture depicted in FIG. 10.

FIG. 15 provides a functional block level implementation of the Look-Ahead AGC element 950. While the Look-Ahead AGC element is described at a functional block level, one skilled in the art will recognize in light of the detailed description provided herein that these functions may readily be implemented in software, hardware, firmware, or any combination thereof, within the spirit of the invention. Further, although a single channel is presented in FIG. 15, two such sections may be used for a stereo presentation.

In the Look-Ahead AGC implementation 1510 illustrated in FIG. 15, the channel input signal is received at the input of a delay line 1512. Preferably, delay line 1512 is a digital delay line, and may accommodate one thousand (1000) samples of the channel input at a sampling frequency of about 48 kHz. The output of the delay line 1512 is applied to an input of a voltage controlled amplifier 1514. The operation of the voltage controlled amplifier is controlled by a signal level obtained by applying a filtering function 1516 to the sample from delay line 1512, preferably the sample residing in input element 1518. Preferably, as the filtered sample level increases, the gain of the voltage controlled amplifier 1514 is decreased, and vice versa, as depicted by the minus (−) sign which labels the control input of voltage controlled amplifier 1514.

Preferably, the filtering function 1516 provides a low pass function, and is represented in FIG. 15 by a variable capacitance 1520 in series with a variable resistance 1522 and which is connected between the output of the first block of delay line 1512 and a reference voltage, such as ground. Thus, frequencies below the cut-off frequency of the low pass function 1516 will have the greatest impact on the gain adjustment of voltage controlled amplifier 1514, while frequencies above the cut-off frequency will have a proportionally reduced effect. As will be understood by those skilled in the art, the settings of the variable capacitance and the variable resistance of filtering function 1516 will affect the frequency characteristics of the filtering function. In operation these settings may be determined according to the processing requirements of other processing functions described herein which are performed in connection with the operation of the present invention.

It is also to be noted that Look-Ahead AGC element 1510 provides an inherent time delay at the output end of the signal processing flow. It has been found for the present invention that implementing a time delay function at this point in the process flow is preferred over the use of time delays in each of the banded channels at the front end of the signal flow. Among the advantages of such a configuration is a buffering feature that allows modification of the waveform before it reaches the listener.

Figure 16A:
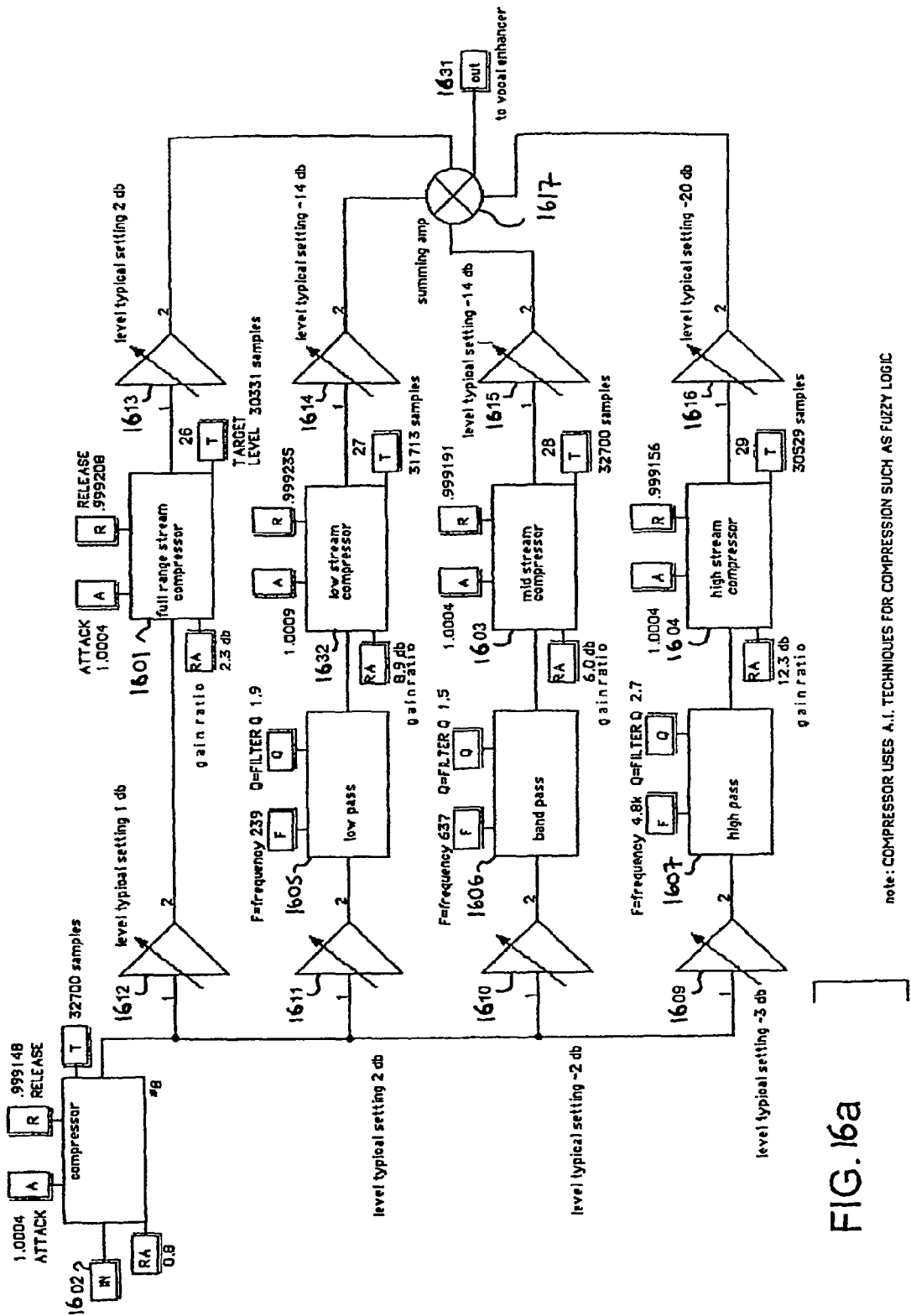
FIG. 16A provides an illustrative example of one implementation of the Adaptive Dynamics type processing block (labeled core process) in FIG. 10.
Figure 16B:
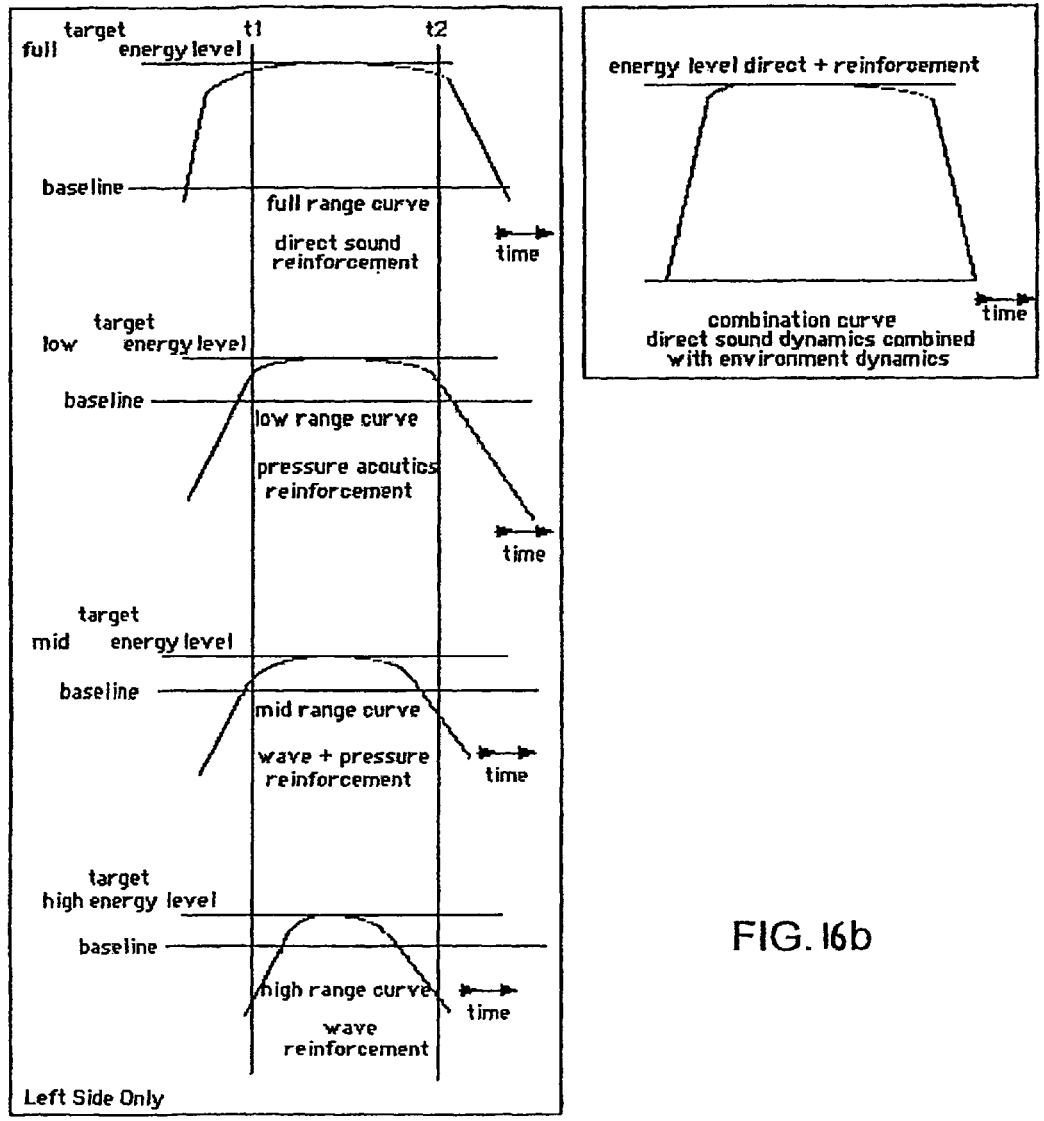
FIG. 16B is an illustration of the time response characteristics of the sound paths of FIG. 16A.

FIG. 16a provides an illustrative example of one implementation of the Adaptive Dynamics type processing block (labeled core process) in FIG. 9. FIG. 16b is an illustration of the time response characteristics of the sound paths of FIG. 16a.

The input signal is received at the input 1602 to the AI (artificial intelligence) dynamics pre-compressor. The signal is distributed equally to a full range buffer amp 1612, low pass buffer amp 1611, band pass buffer amp 1610 and a high pass buffer amp 1609.

The full range stream is routed to the full range stream compressor 1601, modified in the time domain with respect to ratio, envelope attack and envelope release and a maximum target level is set. The signal is then routed to a buffer amp 1613 and then to a summing amp 1617.

The low pass range stream is routed to the buffer amp 1611, through the low pass filter 1605, to the low pass stream compressor 1632, modified in the time domain with respect to ratio, envelope attack and envelope release and a maximum target level is set. The signal is then routed to a buffer amp 1614 and then to a summing amp 1617.

The mid or band pass stream is routed to the buffer amp 1610, through the band pass filter 1606, modified in the time domain with respect to ratio, envelope attack and envelope release and a maximum target level is set. The signal is then routed to a buffer amp 1615 and then to a summing amp 1617.

The high pass stream is routed to the buffer amp 1609, through the high pass filter 1607, modified in the time domain with respect to ratio, envelope attack and envelope release and a maximum target level is set. The signal is then routed to a buffer amp 1616 and then to a summing amp 1617.

The addition of the Full, Low, Mid, and High streams simulates live direct sound impinging on the ear of a live concert listener combined with the low frequency dynamics of the room environment (pressure acoustics) combined the mid range sounds (wave+pressure acoustics) and combined with high frequency sound (wave acoustics). The sum of these waves creates a combination waveform in the time domain that can be normalized in the frequency domain to remove undue frequency non-linearities if desired.

The output 1631 of summing amplifier 1617 is routed to the Voice Enhancer block 934 of FIG. 9.

Included in FIG. 16a are actual parameters for one implementation of the disclosed embodiment. As can be seen from these values, there is a distinct difference in attack, release, gain ratio, and target level used for the compressor blocks in each of the streams. As described above, this difference in parametric settings for the compressor, filter, and gain blocks in each of these streams, is meant to create a time beat or unpredictable character in the processed sound signal.

The attack parameter for the compressor blocks determines how quickly the path responds to changes in increases in the sound levels. The larger the setting for the attack, the quicker the response. The release parameter controls how much the output of the compressor will lag the fall of a sound signal applied to the input of the compressor. The larger the magnitude of the release setting, the greater the lag. The gain ratio is a dynamic ratio of the envelope of the signal of input versus output up to the target level for the compressor block. It is to be noted that the target level is not used as a threshold, but rather as a maximum number of bits (in the digital signal processing sense) allowed for that compressor output.

The settings for the unfiltered, full range stream path [1612→1601→1613] are intended to provide a full bandwidth, high SPL simulation which provides a sound that would be expected from a stage setting without any surrounding environment.

The settings for the low stream path [1611→1632→1614], which handles low frequency sounds, are intended to provide a simulation of sound characteristics which would be expected to emanate from a very "dead" environment, for example, one in which there is very little mid or high frequencies being returned from the environment.

The settings for the mid stream path [1610→1603→1615], which handles mid frequency sounds, are intended to provide a simulation of sound characteristics which would be expected to emanate from a more lively environment, such as a "scoring" stage.

The settings for the high stream path [1609→1607→1616], which handles high frequency sounds, are intended to provide a simulation of sound characteristics which would be expected to emanate off of an even livelier environment, such as a "plaster" walls.

Provided below is a table of typical parametric settings for each of the streams in FIG. 16a.

|  | Full Range | Low Stream | Mid Stream | High Stream |
| --- | --- | --- | --- | --- |
| input buffer - level | 1 dB | 2 dB | −2 dB | −3 dB |
| filter - F | — | 239 Hz (low pass) | 637 Hz (bandpass) | 4.8 kHz (high pass) |
| filter - Q | — | 1.9 | 1.5 | 2.7 |
| compressor - A | 1.0004 | 1.0009 | 1.0004 | 1.0004 |
| compressor - R | 0.999208 | 0.999235 | 0.999191 | 0.999156 |
| compressor - RA | 2.3 dB | 8.9 dB | 6.0 dB | 12.3 dB |
| compressor - T | 30331 samples | 31713 samples | 32700 samples | 30259 samples |
| output buffer - level | 2 dB | −14 dB | −14 dB | −20 dB |

Another set of parameters which operate satisfactorily are:

|  | Full Range | Low Stream | Mid Stream | High Stream |
| --- | --- | --- | --- | --- |
| input buffer - level | 1 dB | 2 dB | −2 dB | −3 dB |
| filter - F | — | 239 Hz (low pass) | 637 Hz (bandpass) | 4.8 kHz (high pass) |
| filter - Q | — | 1.9 | 1.5 | 2.7 |
| compressor - A | 1.0004 | 1.0005 | 1.0001 | 1.0003 |
| compressor - R | 0.999208 | 0.999235 | 0.999191 | 0.999156 |
| compressor - RA | 2.3 dB | 8.9 dB | 6.0 dB | 12.3 dB |
| compressor - T | 30331 samples | 31713 samples | 32700 samples | 30259 samples |
| output buffer - level | 2 dB | −14 dB | −14 dB | −20 dB |

Referring now to FIG. 16b, the left hand set of graphs illustrate for each of the different sound paths or streams, the relationship between the attack, release, target level, and gain ratio. Also, the time relationship of the response characteristics as between streams can be seen. Finally, the graph on the right hand side of the sheet illustrates the combined response characteristics of the process. Therefore, from these curves it can be seen that environment dynamics are provided by each of low stream, mid stream and high stream sound paths, and that direct sound dynamics are provided by the full range stream path.

In this embodiment, the full range stream path provides direct sound reinforcement, the low range stream path provides pressure acoustics reinforcement, the mid range stream path provides both wave and pressure reinforcement, and the high range stream path provides wave reinforcement.

It is to be noted that the graphs for each of these streams illustrates the differences in attack, release, gain ratio and target level between the streams as a function of time. Thus, the envelope for the full range stream has the largest energy level relative to the indicated base line, and sharper rise and fall times than the other streams. It is also to be noted that, relative to the points in time of t1 and t2 for each of the curves, the high stream path concentrates most of its energy in the middle portion of the time period between t1 and t2. On the other hand, the energy distribution for the low range stream occupies much of the period between t1 and t2, and even extends to points before t1 and beyond t2.

With continued reference to FIG. 16a, the preferred embodiment includes a "proximity control" feature that allows the listener to adjust the ratio of the direct sound stage versus the reflected (or otherwise simulated) sound stage. The proximity control feature can be implemented in the example embodiment by providing adjustable access to the gain ratio element of the full range stream compressor 1601. As this gain ratio is increased, the output signal received by the listener will be more direct in nature, with less reflective content. Conversely, as this gain ratio is decreased, the output signal received by the listener will be less direct in nature, with more reflective content. In practical embodiments, this gain ratio will have a range of 0.8 to 5.0, with a nominal range of 1.2 to 2.5.

Although preferred embodiments are illustrated in the accompanying drawings and described in the foregoing detailed description, it will be understood that the inventions are not limited to the embodiments disclosed, but are capable of numerous rearrangements, modifications and substitutions without departing from the spirit of the inventions as set forth and defined by the claims and equivalents thereof.

What is claimed is:
1. A method for enhancing audio signals, comprising:
receiving an audio signal;
separating the audio signal into component signals corresponding to discrete bands, wherein the component sig- nals comprise a full bandwidth component signal, a bass component signal, a midrange component signal, and a treble component signal;

processing the component signals with distinct processing pathways to obtain processed component signals, wherein the distinct processing pathways include a full bandwidth pathway for processing the full bandwidth component signal without sound-level decompression, wherein sound-level decompression comprises widening a dynamic range of one or more of the component signals after compression, a bass pathway for processing the bass component signal with sound-level decompression, a midrange pathway for processing the midrange component signal with sound-level decompression, and a treble pathway for processing the treble component signal with sound-level decompression;

determining a sound delay of each of the component signals based on at least a gain ratio parameter and a target level parameter used in processing each of the component signals, the gain ratio parameter representing a dynamic ratio of the envelope of signal input versus signal output up to a target level, the target level parameter representing a maximum number of bits allowed for compressor output;

aggregating the processed component signals to recreate a standard signal in one or more channels, the aggregating compensating for the sound delay of each of the component signals; and performing additional post-processing on the standard signal.

2. The method according to claim 1, wherein the audio signal is a compressed audio signal.

3. The method according to claim 1, wherein the post-processing comprises at least one of:
recording environment simulation for adding diffusion, reverb, depth, regeneration, and room decay to the enhanced audio signal;
voice elimination for reducing vocals in the enhanced audio signal; wide stereo enhancement for adding wider stereo perspective to the sound field of the enhanced audio signal;
parametric equalization for providing broad spectrum shaping of the enhanced audio signal;
wall simulation for producing time delays that simulate reflections from a stage;
room simulation for producing time delays that simulate natural room acoustics; and
karaoke enhancement for removing equal energy components from left and right signal channels.

4. The method according to claim 1, wherein the post-processing includes room simulation for compensating for poor room acoustics in a listening environment for the enhanced audio signal.

5. The method of claim 1, wherein the parameters based on which the sound delay is determined further based on attack and release parameters.

6. The method of claim 1, wherein a first set of gain ratio and target level parameters are applied to the midrange component signal and a second set of gain ratio and target level parameters are applied to the treble component signal, the first and second set of parameters inducing different sound delays.

7. A system for enhancing audio signals, comprising:
a processor for:
receiving an audio signal; and
separating an audio signal into component signals corresponding to discrete bands, wherein the component signals comprise a full bandwidth component of the audio signal, a bass component of the audio signal, a midrange component of the audio signal, and a treble component of the audio signal;
processing the component signals with distinct processing pathways, including:
a full bandwidth pathway for processing the full bandwidth component of the audio signal, the full bandwidth pathway producing a processed full bandwidth signal without sound-level decompression, wherein sound-level decompression comprises widening a dynamic range of one or more of the component signals after compression;
a bass pathway for processing the bass component of the audio signal and producing a processed bass component signal with sound-level decompression;
a midrange pathway for processing the midrange component of the audio signal and producing a processed midrange component signal with sound-level decompression; and
a treble pathway for processing the treble component of the audio signal and producing a processed treble component signal with sound-level decompression;
determining a sound delay of each of the component signals based on at least a gain ratio parameter and a target level parameter used in processing each of the component signals, the gain ratio representing a dynamic ratio of the envelope of signal input versus signal output up to a target level, the target level representing a maximum number of bits allowed for compressor output;
a mixer configured to combine the processed full bandwidth signal, the processed bass component audio signal, the processed midrange component audio signal, and the processed treble component audio signal into a mixed audio signal, the mixer further configure to compensate for the sound delay of each of the component signals; and
one or more post-processing elements for further enhancement of the mixed audio signal.

8. The system according to claim 7, wherein the one or more post-processing elements comprises at least one of:
a recording environment simulator configured to add diffusion, reverb, depth, regeneration, and room decay to the mixed audio signal;
a voice elimination element configured to reduce vocals in the mixed audio signal;
a wide stereo enhancement element configured to add wider stereo perspective to the sound field of the mixed audio signal;
a parametric equalizer configured to provide broad spectrum shaping of the mixed audio signal;
a wall simulator configured to produce time delays that simulate reflections from a stage;
a room simulator configured to produce time delays that simulate natural room acoustics; and
a karaoke enhancement element configured to remove equal energy components from left and right signal channels.

9. The system of claim 7, wherein the sound delay is determined further based on attack and release parameters.

10. The system of claim 7, wherein a first set of gain ratio and target level parameters are applied to the midrange component signal and a second set of gain ratio and target level parameters are applied to the treble component signal, the first and second set of parameters inducing different sound delays.

11. An apparatus for playback of digital audio files, said apparatus comprising:
a digital audio signal source;
at least one processor coupled to the digital audio signal source, said at least one processor being configured to:
receive an audio signal from the digital audio signal source;
separate the audio signal into component signals corresponding to discrete bands, wherein the component signals comprise a full bandwidth component signal, a bass component signal, a midrange component signal, and a treble component signal;
process the component signals with distinct processing pathways to obtain processed component signals, wherein the distinct processing pathways include a full bandwidth pathway for processing the full bandwidth component signal without sound-level decompression, wherein sound-level decompression comprises widening a dynamic range of one or more of the component signals after compression, a bass pathway for processing the bass component signal with sound-level decompression, a midrange pathway for processing the midrange component signal with sound-level decompression, and a treble pathway for processing the treble component signal with sound-level decompression;
determine a sound delay of each of the component signals based on at least a gain ratio parameter and a target level parameter parameters used in processing each of the component signals, the gain ratio parameter representing a dynamic ratio of the envelope of signal input versus signal output up to a target level, the target level parameter representing a maximum number of bits allowed for compressor output;
aggregate the processed component signals to recreate a standard signal in one or more channels, the aggregating compensating for the sound delay of each of the component signals; and
perform additional post-processing on the standard signal to generate mask artifacts and response anomalies introduced by a codec and equipment used, resulting in an enhanced audio signal; and
one or more speaker drivers coupled to the processor, the one or more speaker drivers being configured to drive one or more speakers for playback of the enhanced audio signal.

12. The apparatus of claim 11, wherein the sound delay is determined further based on attack and release parameters.

13. The apparatus of claim 11, wherein a first set of gain ratio and target level parameters are applied to the midrange component signal and a second set of gain ratio and target level parameters are applied to the treble component signal, the first and second set of parameters inducing different sound delays.

14. A system for enhancing audio signals, comprising:
a processor for processing component signals with distinct processing pathways, including:
a full bandwidth pathway for processing a full bandwidth component of an audio signal, the full bandwidth pathway producing a processed full bandwidth signal, the full bandwidth pathway comprising:
a first input amplifier having an input for the audio signal, a first output amplifier having an output for the processed full bandwidth signal, and a first compressor connected between the first input amplifier and the first output amplifier;
a bass pathway for processing a bass component of the audio signal and producing a processed bass component of the audio signal, the bass pathway comprising:
a second input amplifier having an input for the audio signal, the second input amplifier having an output connected to an input of low-pass filter, the low-pass filter having an output connected to an input of a first expander for performing sound-level decompression, wherein sound-level decompression comprises widening a dynamic range of one or more of the component signals after compression, the first expander having an output connected to an input of a second compressor, an output of the second compressor connected to an input of a second output amplifier;
a midrange pathway for processing a midrange component of the audio signal and producing a processed midrange component of the audio signal, the midrange pathway comprising:
a third input amplifier having an input for the audio signal, the third input amplifier having an output connected to an input of band-pass filter, the band-pass filter having an output connected to an input of a second expander for performing sound-level decompression, the second expander having an output connected to an input of a third compressor, an output of the third compressor connected to an input of a third output amplifier; and
a treble pathway for processing a treble component of the audio signal and producing a processed treble component of the audio signal, the treble pathway comprising:
a fourth input amplifier having an input for the audio signal, the fourth input amplifier having an output connected to an input of high-pass filter, the high-pass filter having an output connected to an input of a third expander for performing sound-level decompression, the third expander having an output connected to an input of a fourth compressor, an output of the fourth compressor connected to an input of a fourth output amplifier;
a mixer configured to combine the processed full bandwidth signal, the processed bass component of the audio signal, the processed midrange component of the audio signal, and the processed treble component of the audio signal into a mixed audio signal, the mixer further configured to determine a sound delay associated with each of the component signals based on at least gain ratio parameter and target level parameter used in processing each of the component signals and compensate for the sound delay of each of the component signals, the gain ratio parameter representing a dynamic ratio of the envelope of signal input versus signal output up to a target level, the target level parameter representing a maximum number of bits allowed for compressor output; and
one or more post-processing elements for further enhancement of the mixed audio signal.

15. The system according to claim 14, further comprising a pre-compressor configured to receive an input audio signal and to generate the audio signal as a compressed representation of the input audio signal.

16. The system of claim 14, wherein the sound delay is determined further based on attack and release parameters.

17. The system of claim 14, wherein a first set of gain ratio and target level parameters are applied to the midrange component signal and a second set of gain ratio and target level parameters are applied to the treble component signal, the first and second set of parameters inducing different sound delays.

* * * * *